United States Patent
Deng et al.

(10) Patent No.: US 6,900,643 B2
(45) Date of Patent: May 31, 2005

(54) RIDE THROUGH IN ELECTRONIC POWER CONVERTERS

(75) Inventors: Duo Deng, Canton, MI (US); Kerry E. Grand, Chesterfield, MI (US); Steven J. Kowalec, Plymouth, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 0 days.

(21) Appl. No.: 10/637,754

(22) Filed: Aug. 6, 2003

(65) Prior Publication Data

US 2005/0030045 A1 Feb. 10, 2005

(51) Int. Cl.$^7$ ............................ G01R 31/08; H02M 3/00
(52) U.S. Cl. ............................................ 324/522; 363/74
(58) Field of Search .................................. 324/522, 537, 324/158.1; 363/41, 56.01–56.04, 56.07, 74–80

(56) References Cited

U.S. PATENT DOCUMENTS 5,115,386 A * 5/1992 Shirahama et al. ........... 363/41

* cited by examiner

Primary Examiner—Vincent Q. Nguyen
(74) Attorney, Agent, or Firm—Seed IP Law Group PLLC

(57) ABSTRACT

A system including a current sensor to sense a current provided by an electronic power converter, the current sensor includes an output; an overcurrent detection circuit with an input coupled to an output of the current sensor; and a logic control circuit configurable to maintain the current provided by the electronic power converter in response to the sensed current having a short circuit magnitude, the logic control circuit including an input coupled to an output of the overcurrent detection circuit and at least one output coupled to at least one switch of the electronic power converter.

27 Claims, 18 Drawing Sheets

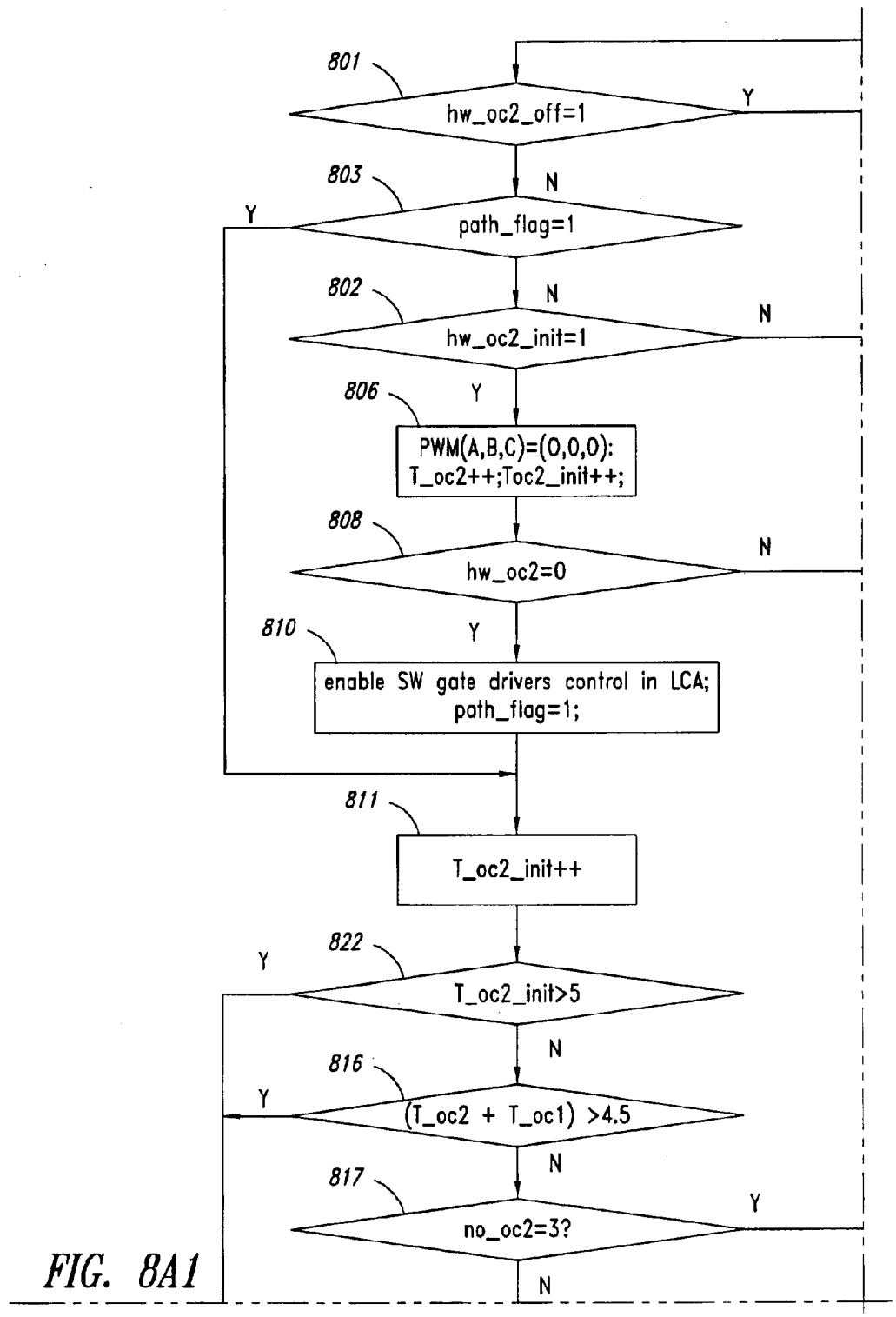
FIG. 8A1

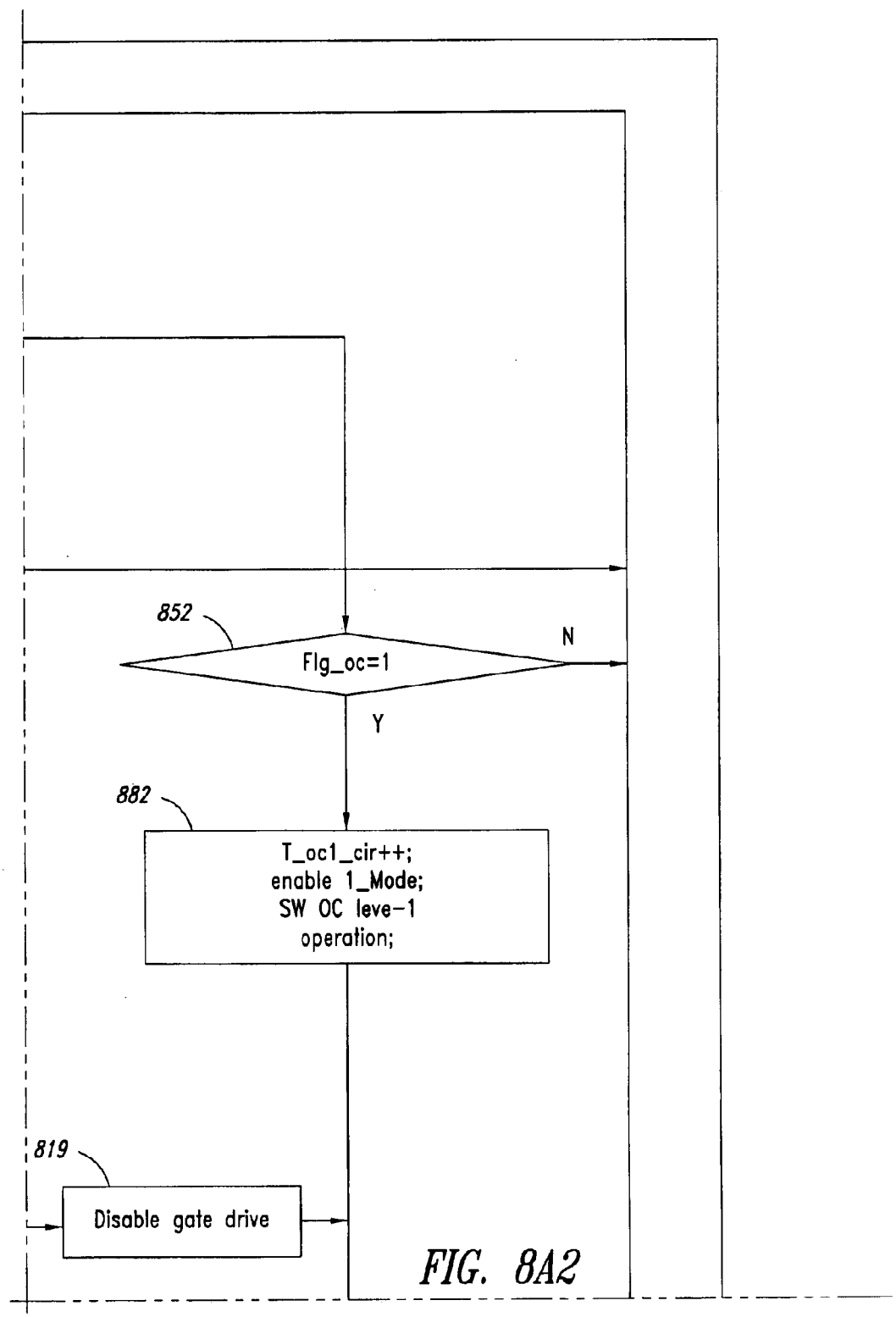
FIG. 8A2

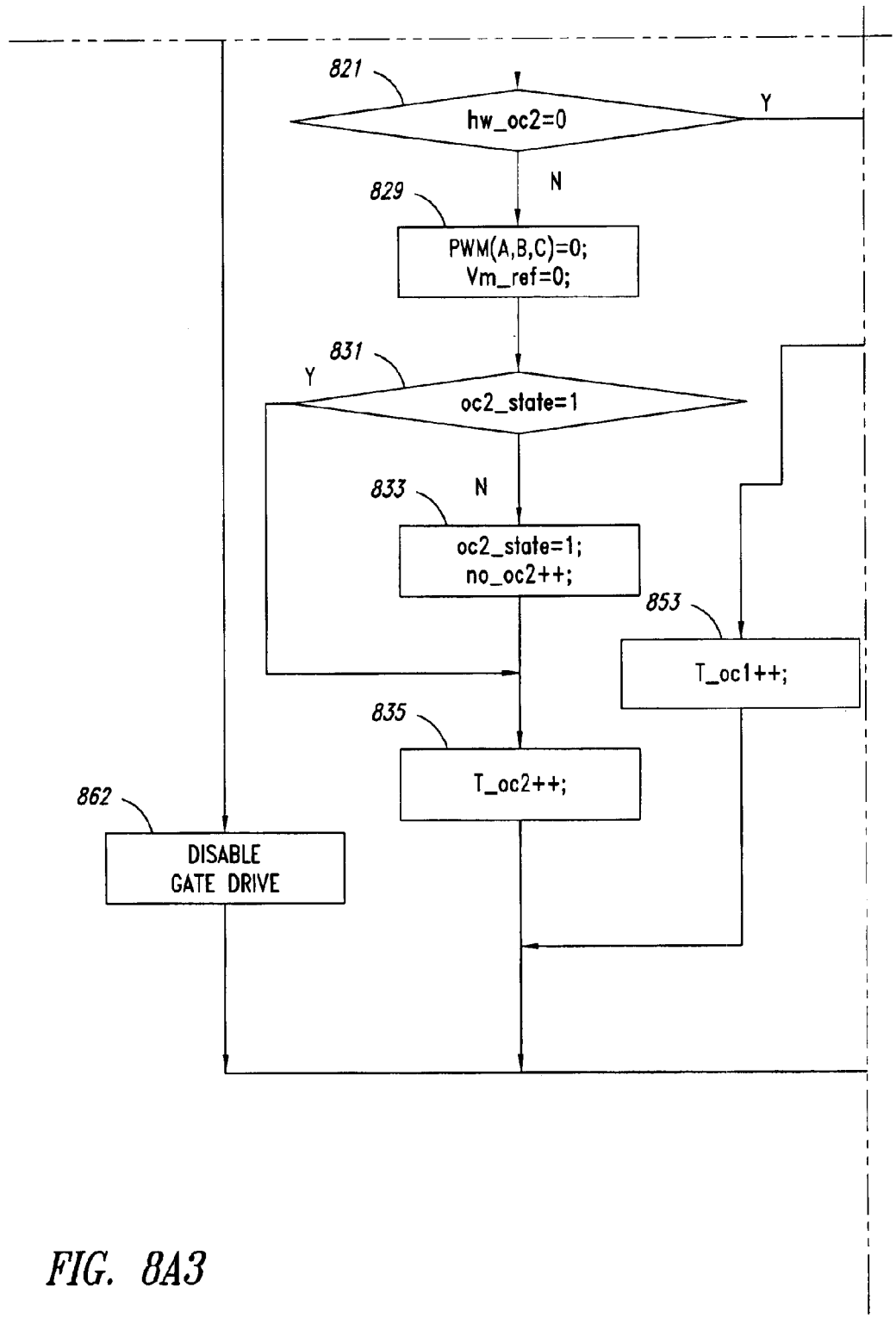
FIG. 8A3

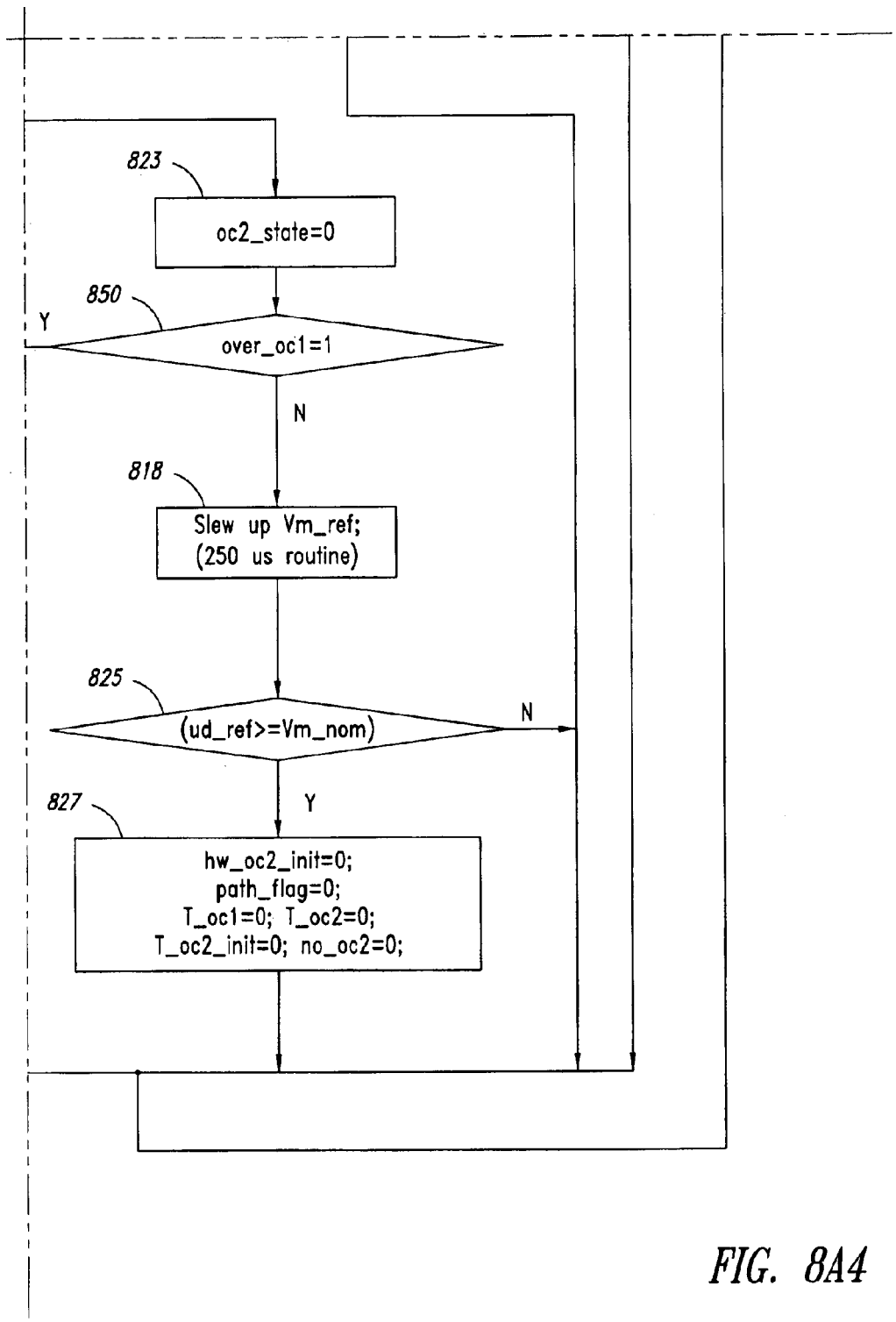
FIG. 8A4

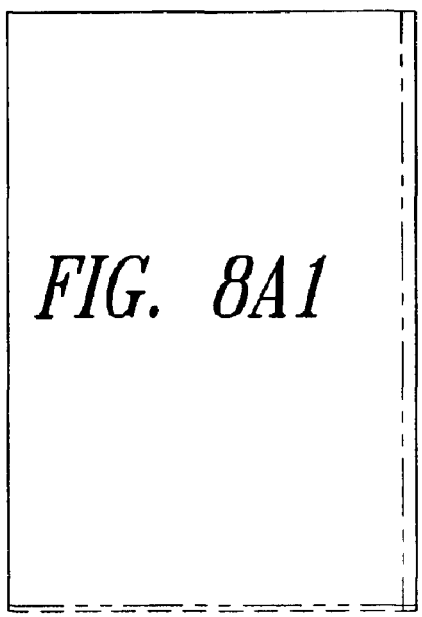
FIG. 8A1
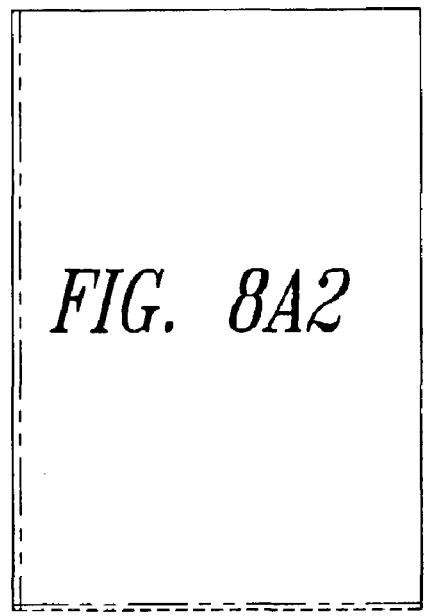
FIG. 8A2
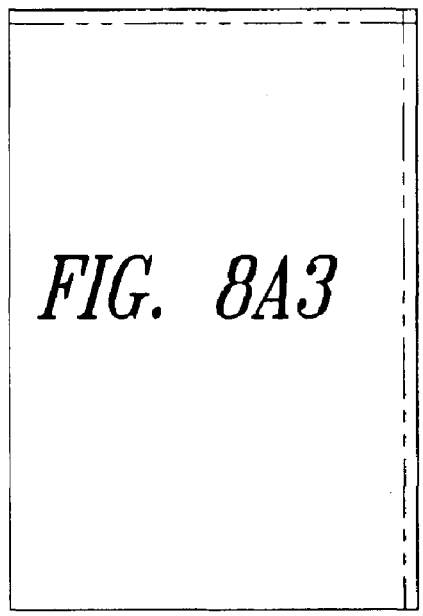
FIG. 8A3
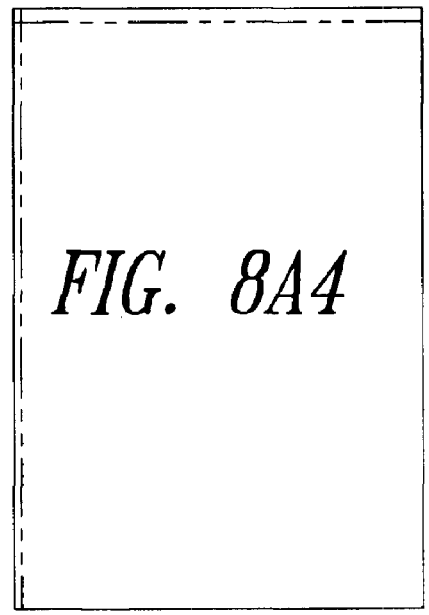
FIG. 8A4
FIG. 8A5

RIDE THROUGH IN ELECTRONIC POWER CONVERTERS

BACKGROUND OF THE INVENTION

1. Field of the Invention

The subject matter of the present application relates, in general, to supplying electrical loads with electrical power.

2. Description of the Related Art

FIG. 1 is a high-level block diagram of electrical power source 100 supplying three-phase electrical power to aggregate electrical loads 102, 104, and 106 (e.g., phases A, B, and C). Aggregate electrical loads 102, 104, and 106 are generally composed of several individual electrical loads. Typically, the individual electrical loads of aggregate electrical loads 102, 104, and 106 have fuses and/or circuit breakers which are constructed such that the fuses and/or circuit breakers isolate the individual electrical loads from power source 100 in the event that a short circuit to ground develops within one or more of the individual loads. As an example of the foregoing, aggregate electrical load 102 is shown composed of load_1 and load_2 which can be respectively isolated out from the phase A power line by actions of fuses and/or circuit breakers 108 and 110.

Both fuses and/or circuit breakers 108 and 110 typically require that the high current conditions responsible for either "blowing" a fuse or "tripping" a circuit breaker exist for a defined duration. The inventors have noted that when power source 100 utilizes an electronic power converter (which typically contains at least one electronic power DC/AC inverter), built-in features meant to protect power source 100 have the unexpected result of causing unnecessary "black time"—a period during which power source 100 is supplying very little effective power to aggregate loads 102, 104, and 106. For example, in many instances built-in protection features of power source 100 will interrupt the supply of power to aggregate loads 102, 104, and 106 before fuse and/or circuit breaker 108 either blows and/or trips to isolate a short circuit at load_1. Consequently, power source 100 will often "cycle" between supplying power and interrupting power since the fuse and/or circuit breaker 108 never successfully isolates short-circuited load_1.

"Traditional" power sources (e.g., AC or DC generators driven by diesel engines) employ a "short circuit ride through" technique to clear any faults within aggregate loads 102, 104, and 106, thereby shortening or eliminating "black time." In the short circuit ride through technique, power source 100 continues to supply power to its aggregate loads 102, 104, and 106 for a period of time sufficient to clear the short circuit by blowing the fuse or tripping the circuit breaker of the shorted load. After the fault is cleared, power source 100 recovers its normal output voltage as soon as possible under the given system constraints.

The inventors have found that when power source 100 utilizes an electronic power converter, direct application of the short circuit ride through technique is not practicable. For example, when power source 100 employs an electronic power converter, the electronic power converter is typically under microprocessor control. The inventors have found that a number of reasons prevent directly implementing the short circuit ride through techniques under microprocessor control. For example, the electronic power converter often burns up or is damaged since power sources that use electronic power converters have much smaller thermal time constants than traditional power sources. In addition, the short circuit ride through techniques are inapposite to the above-discussed existing electronic converter protection routines, so it is not readily apparent how the short circuit ride through techniques may be applied when power source 100 uses an electronic power converter.

In light of the foregoing, the inventors have recognized that a need exists in the art for a process and/or device that provides the functionality of the short circuit ride through technique to power sources using electronic power converters, without damaging the electronic power converters.

BRIEF SUMMARY OF THE INVENTION

In one aspect, a method comprises detecting a short circuit of a current provided by an electronic power converter and maintaining the current provided by the electronic power converter in response to the detected short circuit of the current.

In another aspect, a system comprises a current sensor to sense a current provided by an electronic power converter, the current sensor comprising an output; an overcurrent detection circuit comprising an input coupled to an output of the current sensor; and a logic control circuit configurable to maintain the current provided by the electronic power converter in response to the sensed current having a short circuit magnitude, the logic control circuit comprising an input coupled to an output of the overcurrent detection circuit and at least one output coupled to at least one switch of the electronic power converter.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the devices and/or processes described herein, as defined by the claims, will become apparent in the detailed description set forth herein.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

Figure 7A:
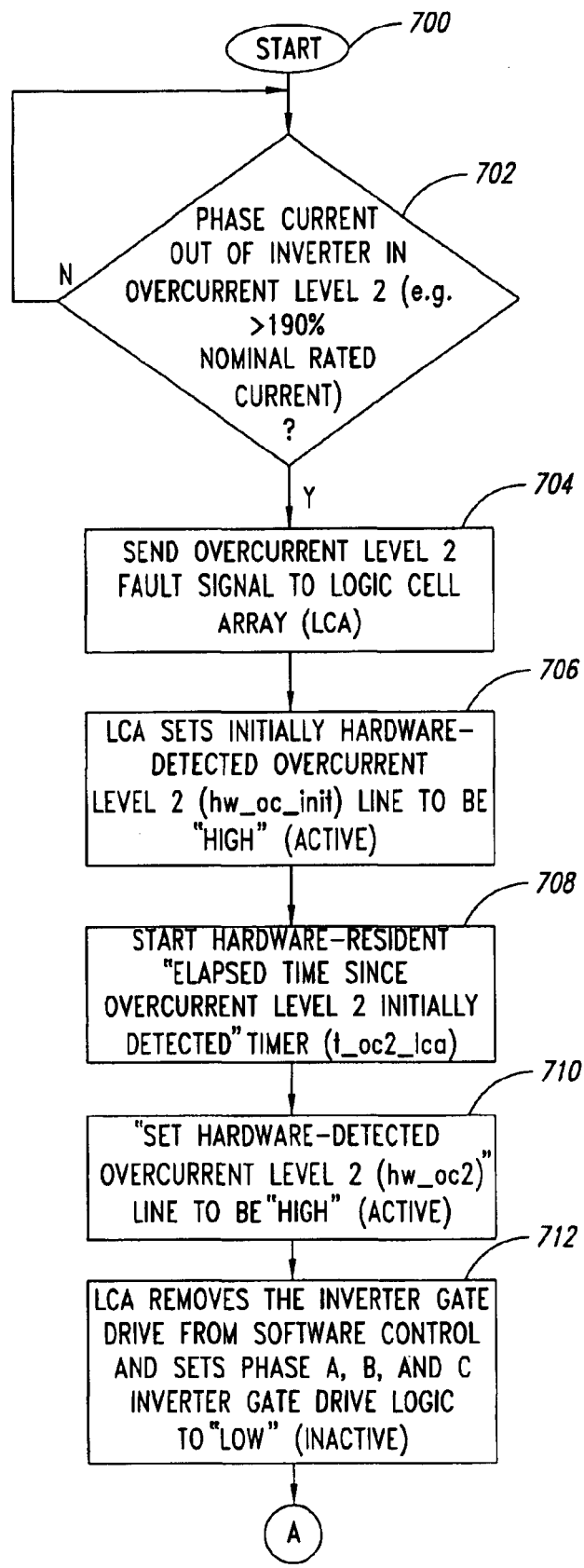
FIGS. 7A–7C show a high-level logic flowchart of a method of operating the system of FIG. 6 according to one illustrated embodiment.
Figure 7B:
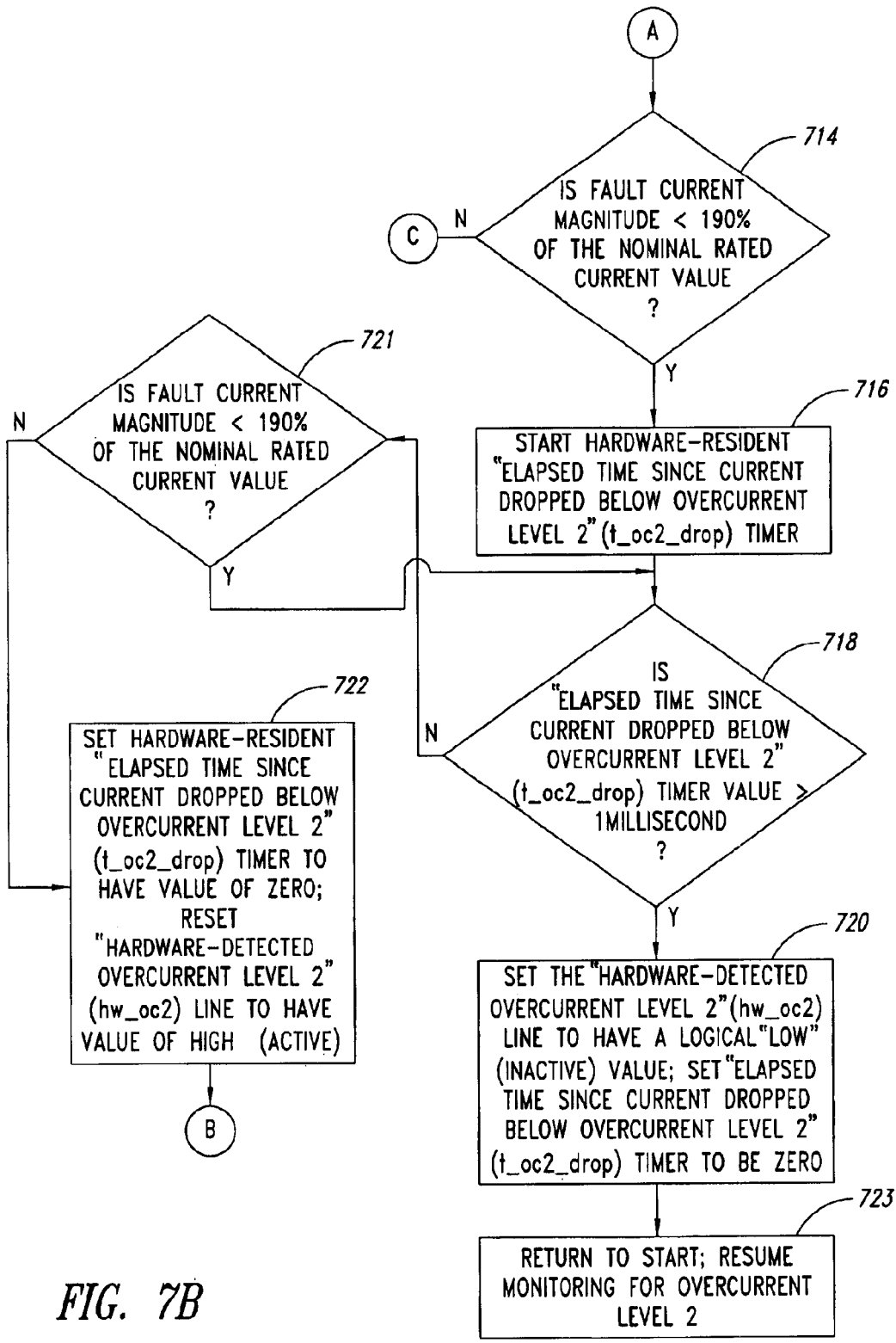
Figure 7C:
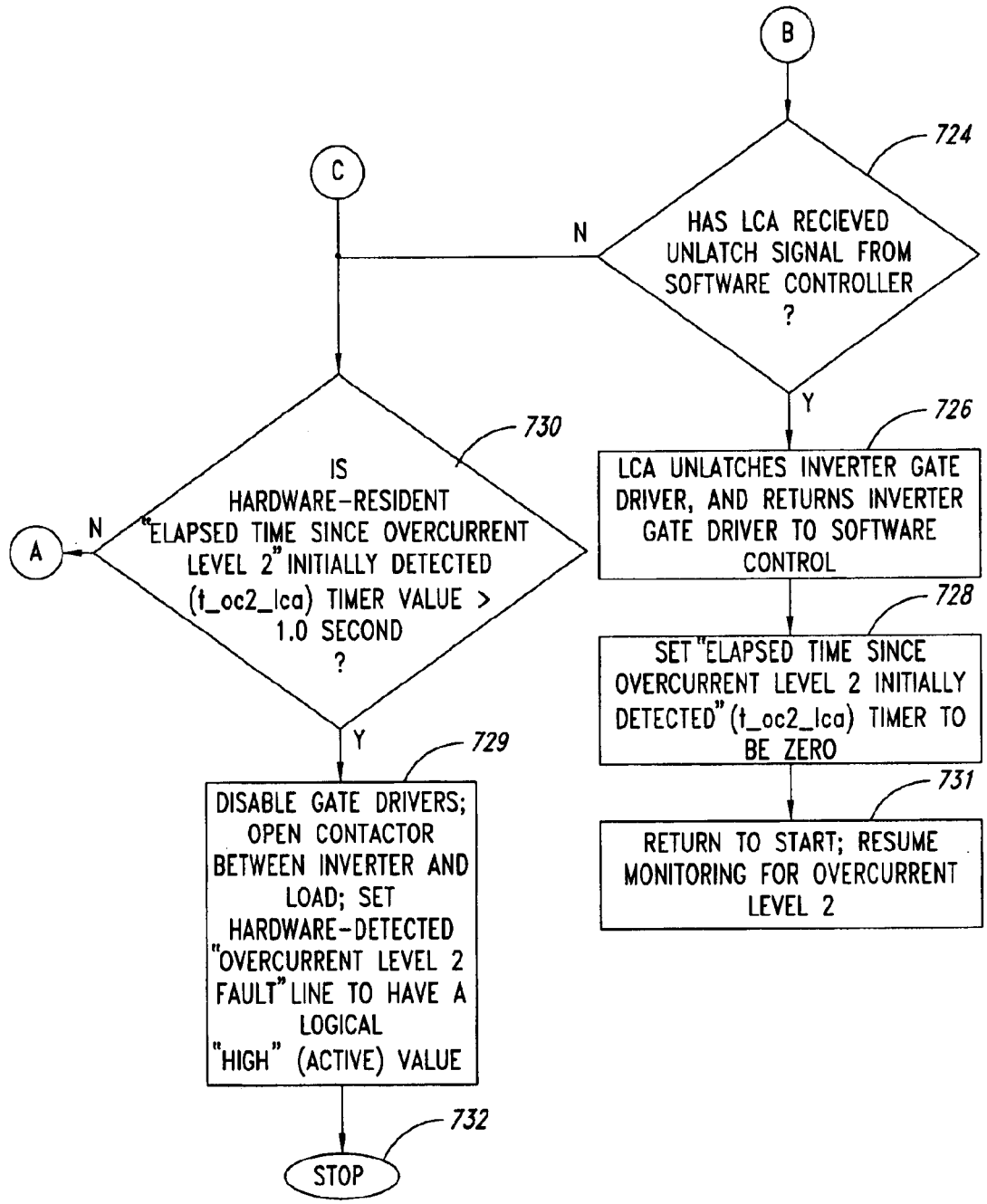

FIGS. 8A1–8A5 and 8B are a high-level logic flowchart depicting a process that interacts and occurs substantially simultaneously with the process described in relation to FIGS. 7A–7C.

DETAILED DESCRIPTION OF THE INVENTION

In the following description, certain specific details are set forth in order to provide a thorough understanding of the various embodiments of the invention. However, one skilled in the art will understand that the invention may be practiced without these details. In other instances, well-known structures associated with electric power systems and/or methods have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Any headings provided herein are for convenience only and do not interpret the scope or meaning of the claimed invention.

A. Devices and Processes

Figure 1:
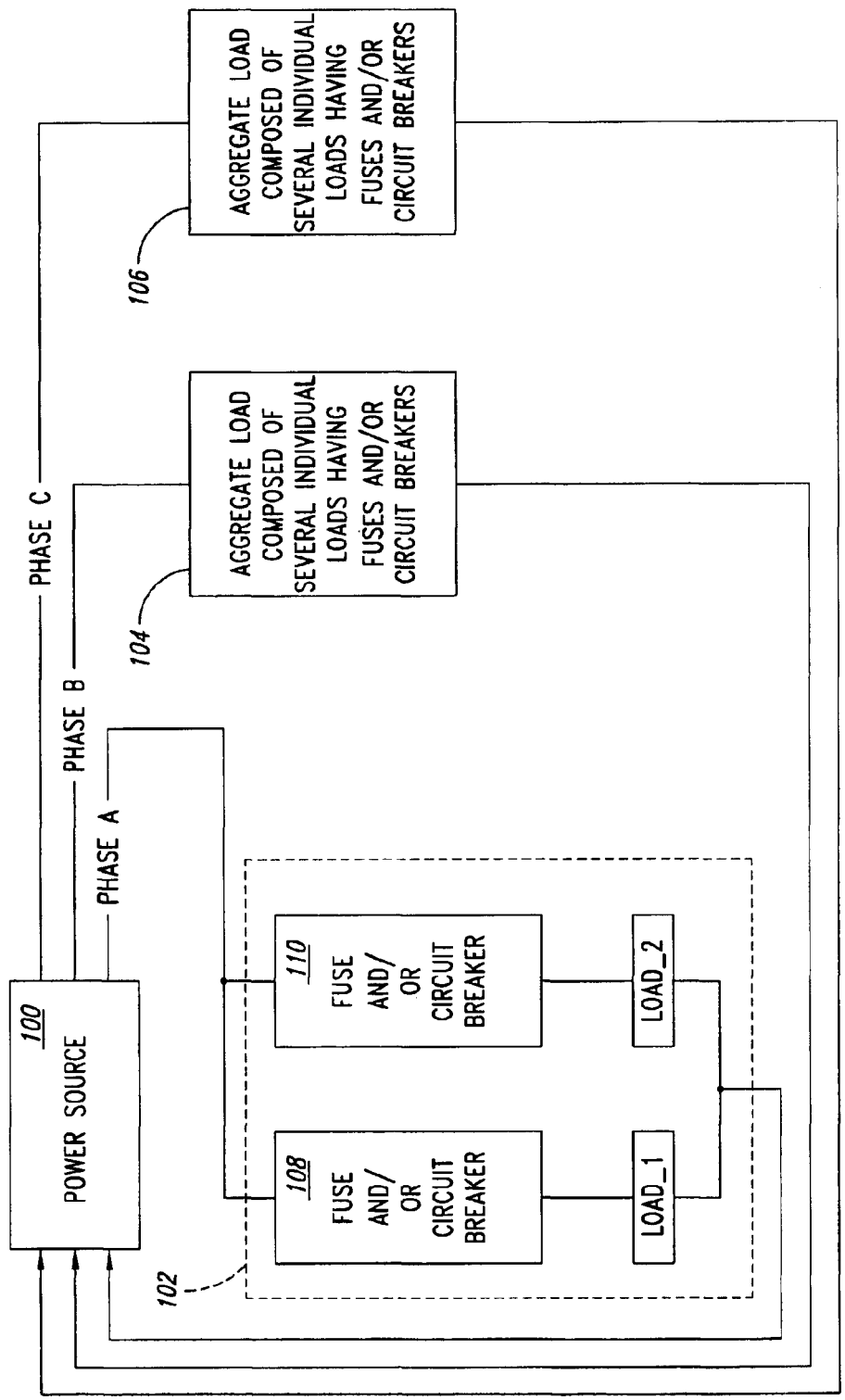
FIG. 1 is a high-level block diagram of an electrical power source supplying three-phase electrical power to aggregate electrical loads.
Figure 2A:
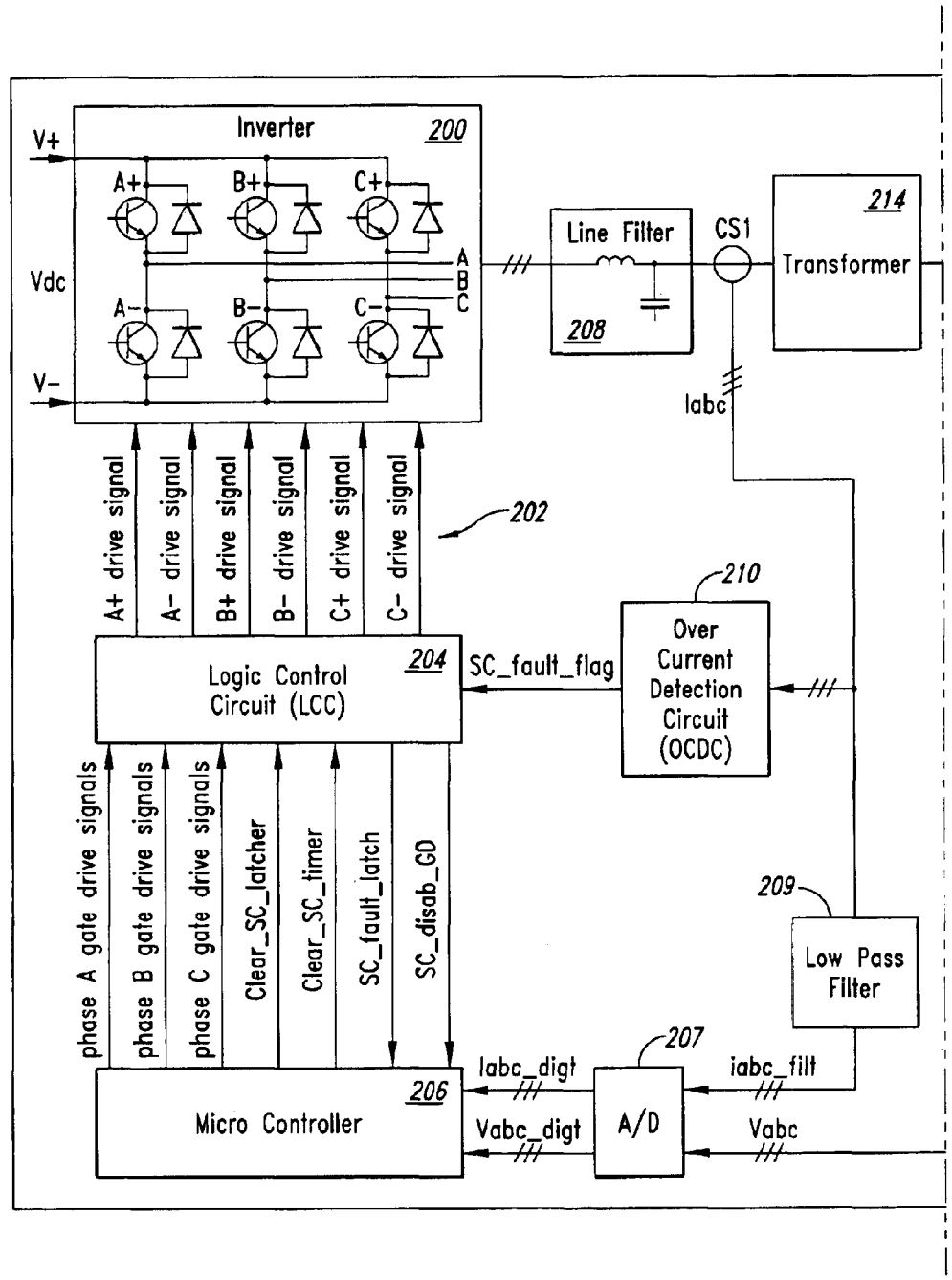
FIGS. 2A–2B are a high-level block diagram of a power source using an electronic power converter.
Figure 2B:
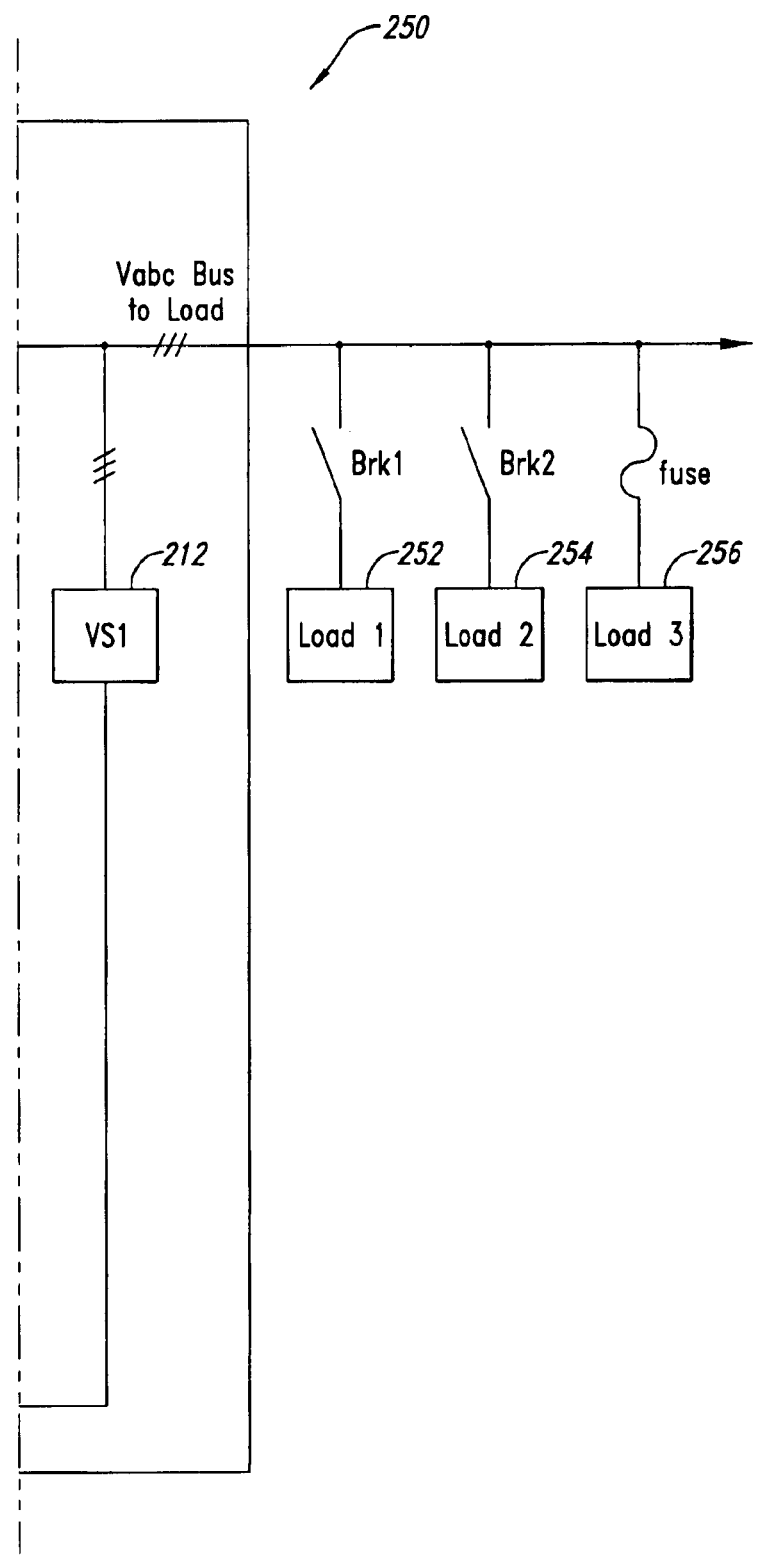

FIGS. 2A–2B are a high-level block diagram of power source 250 using an electronic power converter. Although only a single line is illustrated between inverter 200, line filter 208, and three-phase AC transformer 214, and although only a single current sensor, CS1, is shown on that line, it is to be understood that in FIGS. 2A–2B inverter 200 is transmitting three-phase power through line filter 208 and to three-phase AC transformer 214, where each phase typically has its own power line and current sensor. Although only a single line is illustrated exiting three-phase AC transformer 214, it is to be understood that in FIGS. 2A–2B, three-phase AC transformer 214 is respectively transmitting three-phase power over power lines, where each power line drives an aggregate load on each phase (e.g., aggregate loads 102, 104, and 106 of FIG. 1).

Inverter 200 receives an input voltage Vdc across the positive voltage terminal V+ and the negative voltage terminal V− of a DC power bus. Inverter 200 receives control information from inverter gate drive signals 202. Inverter gate drive signals 202 are controlled by logic control circuit (LCC) 204. In one embodiment, LCC 204 is implemented via a logic cell array.

LCC 204 transmits and/or receives several signals between itself and microcontroller 206. Under certain conditions microcontroller 206 transmits to LCC 204 phase A, phase B, and phase C gate drive signals; a Clear_SC_ latcher signal; and a Clear_SC_timer signal. Under certain conditions LCC 204 transmits to microcontroller 206 an SC_fault_latch signal; and an SC_disab_GD signal. In addition, both LCC 204 and microcontroller 206 exchange data and other signals.

Microcontroller 206 receives as input from analog-to-digital (A/D) converter 207 (a) values indicative of the phase A, B, and C currents transmitted from inverter 200, through line filter 208, and to the primary windings of three-phase AC transformer 214; and (b) values indicative of the phase A, B, and C voltages of the output of the secondary windings of three-phase AC transformer 214 to loads 252, 254, and 256. Circuit breakers Brk1, Brk2, and a fuse are electrically coupled in series with loads 252, 254, and 256, respectively.

LCC 204 receives the values indicative of the currents of the three-phase power transmitted between inverter 200 and three-phase AC transformer 214 from overcurrent detection circuit 210. Overcurrent detection circuit 210 receives input from current sensors that sense the current of each of the three phases (A, B, C). Overcurrent detection circuit 210 transmits a hardware detected short-circuit fault signal (SC_fault_flag) to LCC 204 when monitored current indicates that a fault, such as a short circuit, is detected on any one or more of the three phases of electric power transmitted between inverter 200 and three-phase AC transformer 214.

A/D converter 207 receives the values of the currents of each of the three phases of power transmitted from inverter 200 to three-phase AC transformer 214, and filtered by low pass filter 209, from current sensors (e.g., current sensor CS1). The current sensors (e.g., CS1) are coupled to sense the currents of each of the three phases of electric power transmitted from inverter 200 to three-phase AC transformer 214.

A/D converter 207 receives the values of the voltages on each of the three phases of the output of three-phase AC transformer 214 from voltage sensor circuitry 212. Voltage sensor circuitry 212 is coupled to sense the voltage on each of the three phases of electric power that are supplied to aggregate loads on the three phases (e.g., 252, 254, and 256).

Figure 3A:
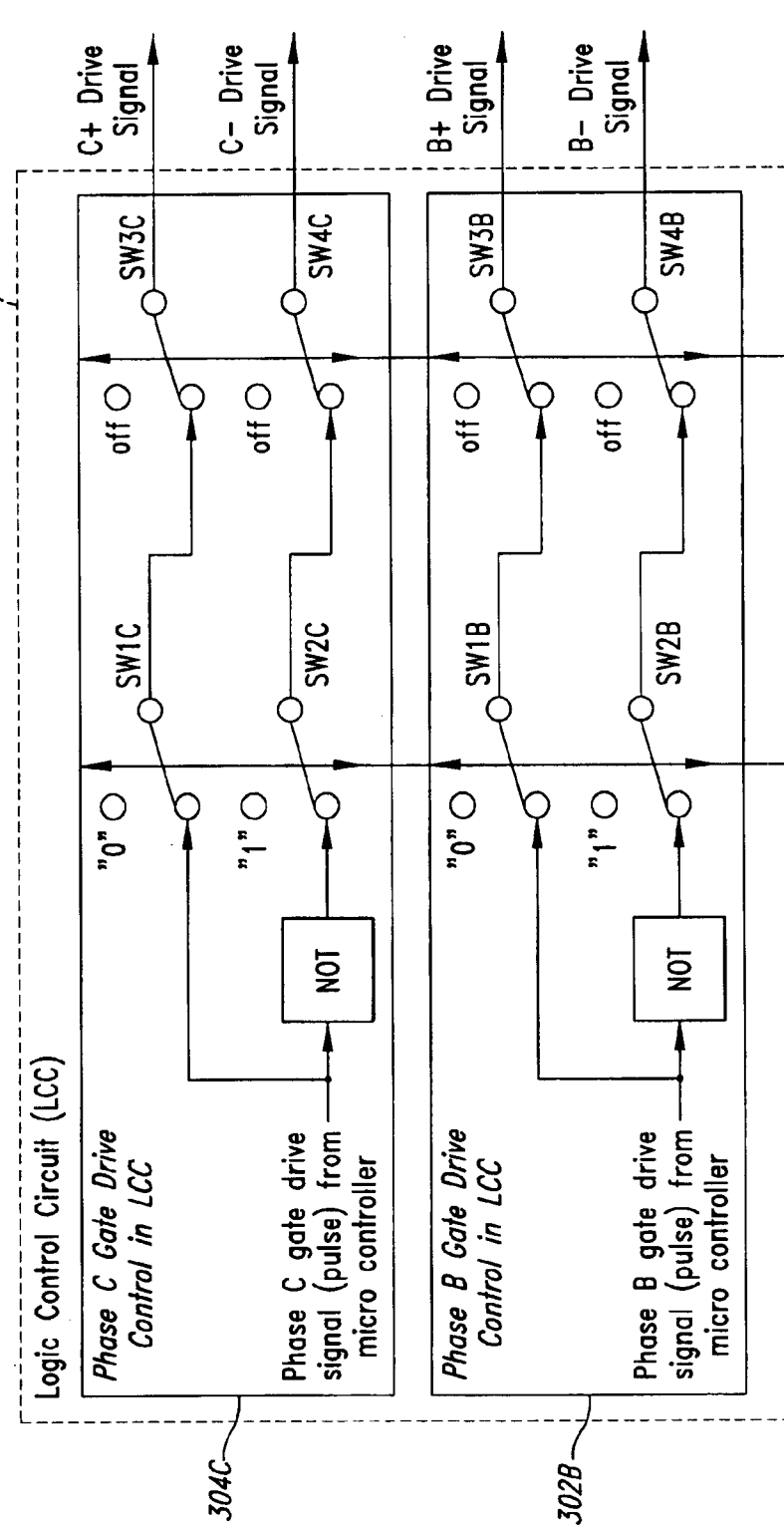
FIGS. 3A–3B are a high-level block diagram of an implementation of a logic control circuit shown in FIG. 2A.
Figure 3B:
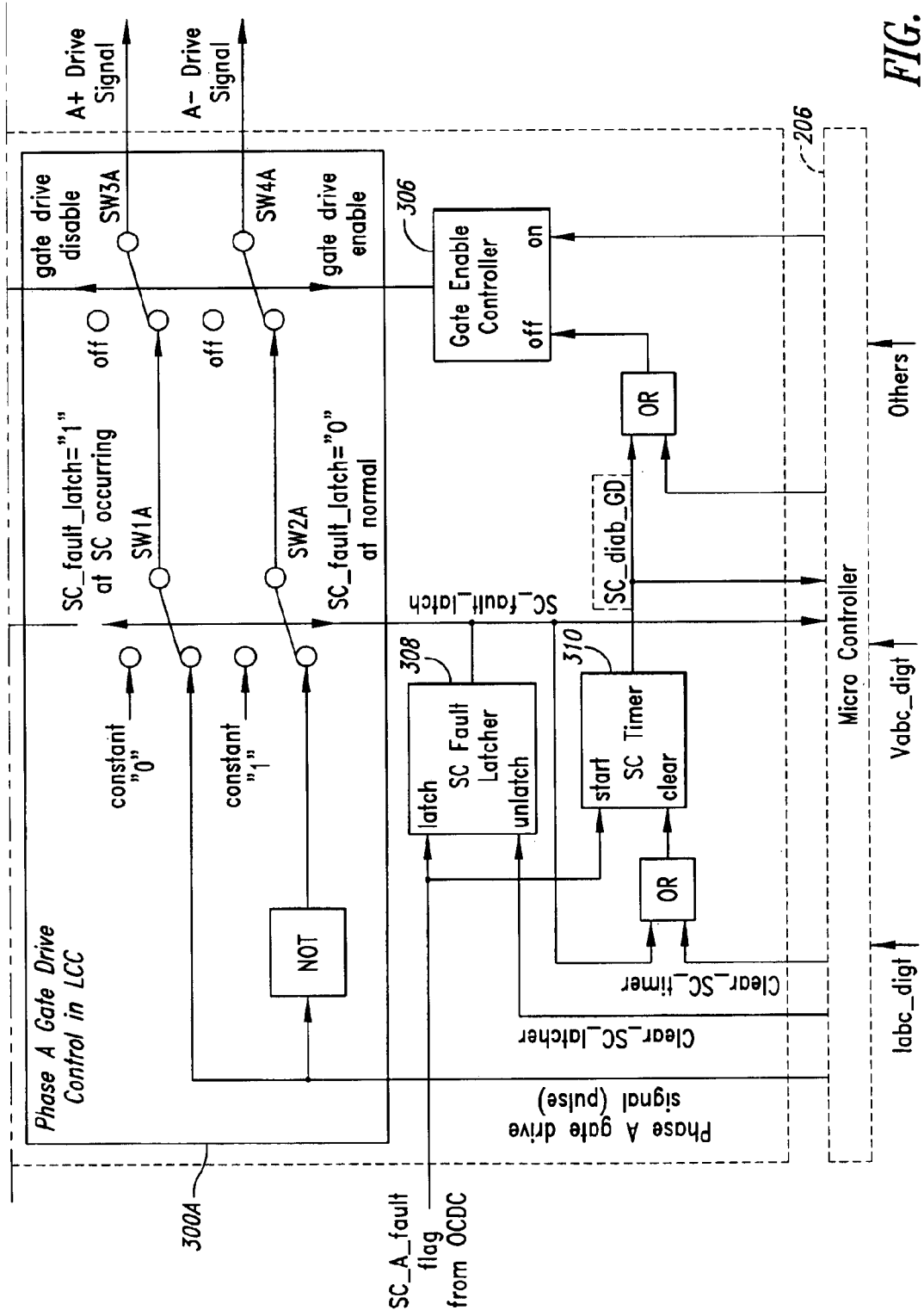

FIGS. 3A–3B are a high-level block diagram of an implementation of LCC 204. LCC 204 contains phase A, B, and C gate drive control units 300A, 302B, and 304C. Each of phase A, B, and C gate drive control units 300A, 302B, and 304C respectively contain switches SW1A, SW2A, SW1B, SW2B, SW1C, and SW2C. In a first position (i.e., down with respect to the orientation in FIGS. 3A–3B), the switches SW1A, SW2A, SW1B, SW2B, SW1C, SW2C provide Pulse Width Modulation (PWM) signals during normal operation. In a second position (i.e., up with respect to the orientation in FIGS. 3A–3B), the switches SW1A, SW2A, SW1B, SW2B, SW1C, SW2C provide PWM signals to Insulated Gate Bipolar Transistors (IGBTs) during short circuit operation.

Each of phase A, B, and C gate drive control units 300A, 302B, and 304C further respectively contain switches SW3A, SW4A, SW3B, SW4B, SW3C, and SW4C that are used to disable gate drive signals to IGBTs with the six switches in off positions (i.e., up with respect to the orientation in FIGS. 3A–3B). When inverter 200 is at "off" or "shut down" condition, the six switches SW3A, SW4A, SW3B, SW4B, SW3C, and SW4C are set to the off position.

In normal operation, upon system startup, microcontroller 206 sends a signal to the "on" input of gate enable controller 306. In response to the on signal from microcontroller 206, the output of gate enable controller 306 will be set to logical 1 (active). In response, switches SW3A, SW4A, SW3B, SW4B, SW3C, and SW4C are driven into an OFF state (i.e., down with respect to the orientation in FIGS. 3A–3B) that allows conduction through them; such switches will continue to allow conduction so long as the output of gate enable controller 306 remains set to logical 1 (active). When switches SW3A, SW4A, SW3B, SW4B, SW3C, and SW4C allow conduction, microcontroller 206 can exercise control of inverter gate drive signals 202 through switches SW1A, SW2A, SW1B, SW2B, SW1C, and SW2C using PWM techniques. The gate drive signals operate to control the IGBTs A+, A−, B+, B−, C+, and C− of inverter 200 to generate the desired output phase A, B, and C voltages (see FIGS. 2A–2B).

The systems of FIGS. 2A–2B and 3A–3B can be used as the context for describing processes which provide short circuit detection and protection. Referring now to FIGS. 2A–2B, when overcurrent detection circuit 210 detects that the sensed magnitude in at least one of the three phases of electric power being output from inverter 200 exceeds a preset level that is defined to represent a short circuit current condition (e.g., 250% of the nominal rated current of inverter 200), overcurrent detection circuit 210 sets its output signal, SC_fault_flag to logical 1 (active); otherwise, overcurrent detection circuit 210 keeps its output signal SC_fault_flag at logical 0 (inactive). (As used herein, the nominal rated current refers to the current level of the normal operating range of a power source.)

Referring now to FIGS. 2A–2B and 3A–3B, when overcurrent detection circuit 210 sets its output signal SC_fault_flag (shown as the phase A fault flag of SC_A_fault in FIGS. 3A–3B) to logical 1 (active), SC fault latcher 308 drives its output signal SC_fault_latch to logical 1 (active); otherwise, SC fault latcher 308 keeps its output signal, SC_fault_latch, at logical 0 (inactive). In response to the SC_fault_latch signal going to logical 1 (active), SW1A, SW2A, SW1B, SW2B, SW1C, and SW2C are all driven to states corresponding to the second positions such that the pulse signals from the microcontroller are disconnected from such switches. In one implementation, switches SW1A, SW2A, SW1B, SW2B, SW1C, and SW2C are configured such that a logical 1 (active) voltage level will be applied to IGBTs A–, B–, and C– of inverter 200, and such that a logical 0 (inactive) voltage level will be applied to IGBTs A+, B+, and C+ of inverter 200. The application of such voltage levels will turn on IGBTs A–, B–, and C– and turn off IGBTs A+, B+, and C+ of inverter 200, resulting in a special operation status of inverter 200 in which there is 0 volt output for all three phases A, B, and C from the inverter but which will allow the original current to keep flowing through 0 voltage source. That is, operation of inverter 200 is not completely shut down upon the detection of the short circuit, but instead the output current is allowed to decay from the detected short circuit magnitude(s)—the concept being that such supply of power will blow any fuses and/or trip any circuit breakers that might be able to isolate a ground fault causing the short circuit condition.

In one embodiment, LCC 204, overcurrent detection circuit 210 and the current sensors are designed in hardware so that output voltage reduction can be very fast when a short circuit condition is detected. For example, in one implementation, it is preferable that the system detect that the sensed current magnitude has exceeded the predefined current value indicating a short circuit within a certain fixed amount of time (e.g., 50 microseconds ($\mu$sec)). Simultaneous with the foregoing described components continuing to supply power to the loads, hardware, software, and/or firmware of the system engage in various processes. Various embodiments of the various processes are illustrated following.

Figure 4A:
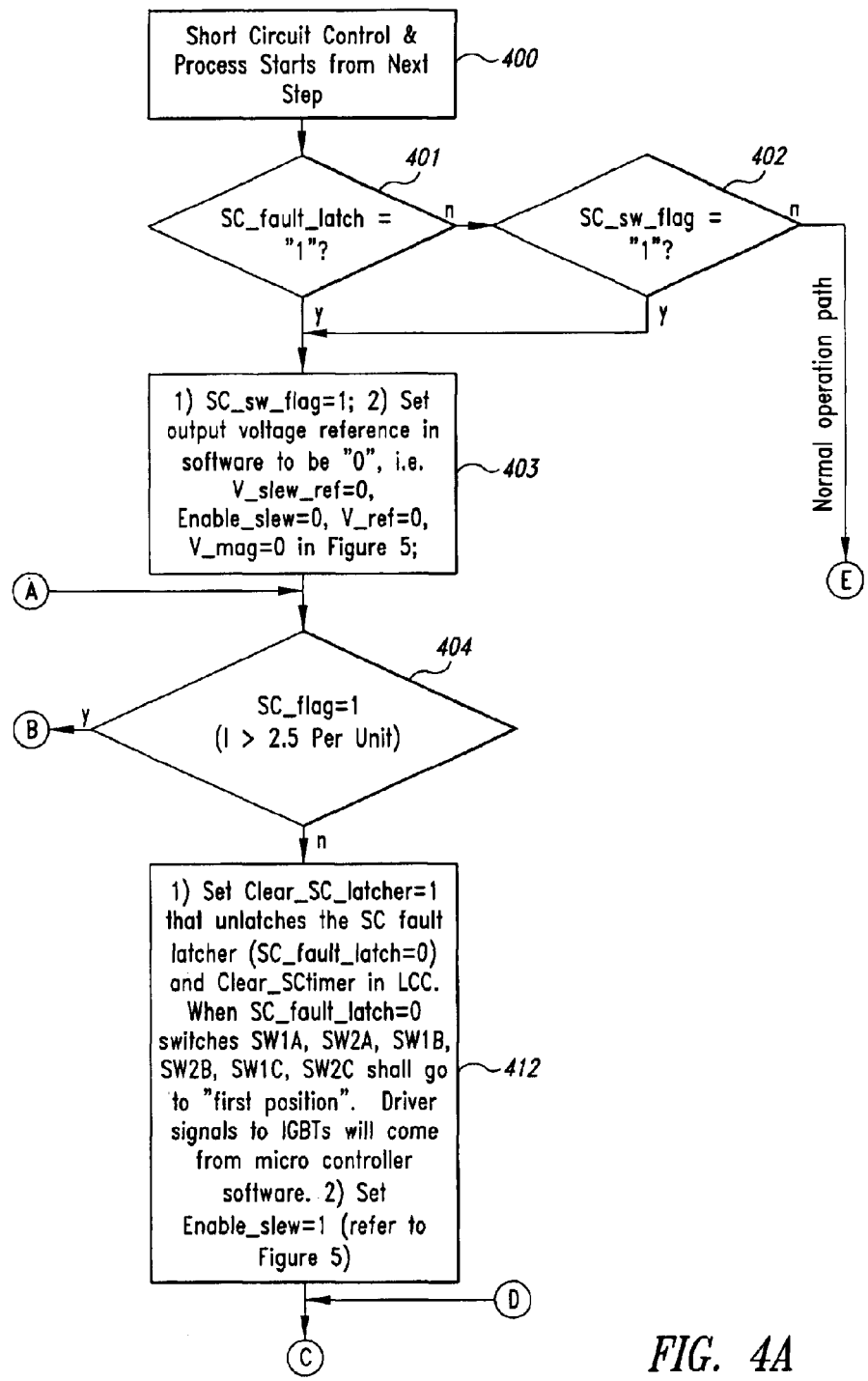
FIGS. 4A–4B are a high-level logic flowchart depicting a process that interacts and occurs substantially simultaneously with the processes described in relation to FIGS. 2A–2B and 3A–3B.
Figure 4B:
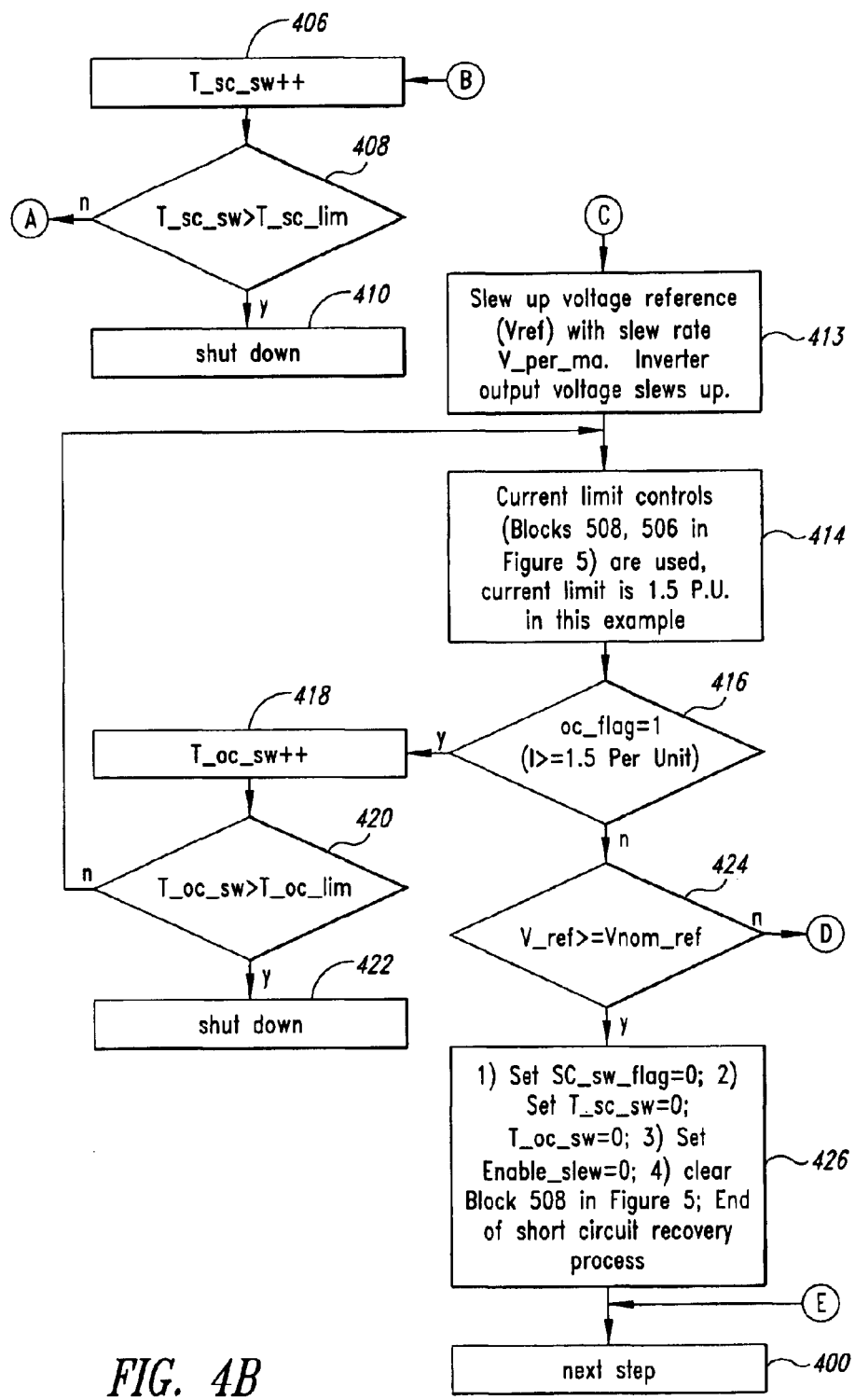

FIGS. 4A–4B are a high-level logic flowchart depicting a process that interacts and occurs substantially simultaneously with the processes and devices described in relation to FIGS. 2A–2B and 3A–3B. As noted, in one implementation the foregoing processes described in relation to FIGS. 2A–2B and 3A–3B are executing in hardware/firmware devices, while the process of FIGS. 4A–4B is executing in software. The process of FIGS. 4A–4B forms a continuous loop that can be described as starting at step 400 ("next step").

In step 401, microcontroller 206 determines whether a short circuit fault latch signal, SC_fault_latch, of SC fault latcher 308 has been set to have a value of logical 1 (active). If the SC_fault_latch signal of SC fault latcher 308 is active, in step 403 microcontroller 206 (a) sets its phase A, B, and C gate drive output signals to logical 0 (inactive), which causes a logical 0 voltage level to drive A+, B+, and C+ and a logical 1 voltage level to drive A–, B–, and C– IGBTs of inverter 200; and (b) sets the software detected short circuit fault flag SC_sw_flag to logical 1 (active). By doing the foregoing, when the microcontroller 206 again resumes control of the switches of inverter 200, after a hardware detected short circuit has been resolved (e.g., as has been described in relation to FIGS. 2A–2B and 3A–3B), inverter 200 initially will be configured in the same way as inverter 200 was configured under hardware control (i.e., with the switches configured such that inverter 200 has output of 0 volts and such that the current(s) to the load(s) can decay from the short circuit magnitudes).

Returning to step 401, if the SC_fault_latch signal does NOT have a value of logical 1 (active), in step 402 microcontroller 206 determines whether the software detected short circuit flag signal SC_sw_flag of a program running on microcontroller 206 has a value of logical 1 (active). If the SC_sw_flag signal has been set to logical 1 (active), microcontroller 206 continues at step 403 as previously described. If the SC_sw_flag signal has NOT been set to logical 1 (active), microcontroller 206 loops to step 400.

In step 404 microcontroller 206 monitors output currents in phases A, B, and C—via the Iabc_digt signals of A/D converter 207—to determine if the output current of any phase is higher than the current magnitude I_sc_lim associated with a short circuit current magnitude threshold (e.g., a threshold of 250% of nominal rated current). If the output current of any phase is higher than the short circuit current magnitude threshold I_sc_lim, in step 406 microcontroller 206 increments a timer T_Sc_sw used to count the time during which the magnitude of the current is above the short circuit current magnitude threshold. In step 408, microcontroller 206 determines whether the count held in the timer T_sc_sw is larger than a predetermined upper limit T_sc_lim on the time during which the current may remain at or above short circuit. If the count held in the timer T_sc_sw is larger than the predetermined upper limit, T_sc_lim, in step 410 microcontroller 206 will shut down operation of inverter 200. For example, in one implementation the upper limit time is 1 second, and if a short circuit exists for longer than 1 second inverter 200 is shut down. Steps 408 and 410 ensure that when inverter 200 has been set to try to clear a fault by tripping a circuit breaker or blowing a fuse (e.g., setting inverter 200 output to be zero volts but keeping a primary of three-phase AC transformer 214 connected to ground such that current can flow out to a potential short circuit), inverter 200 will be completely disabled unless the output current has dropped below the current magnitude defined to indicate a short circuit (e.g., 250% of nominal rated current) within the predefined time limit of T_sc_lim (e.g., 1 second).

Returning to step 408, if microcontroller 206 determines that the count held in the timer T_sc_sw is NOT larger than the predetermined upper limit T_sc_lim microcontroller 206 engages in step 404 as previously described.

Returning to step 404, if the output current of any phase is NOT higher than the short circuit current magnitude threshold I_sc_lim, in step 412 microcontroller 206 sets its Clear_SC_latcher signal to logical 1 (active), its Clear_SC_timer signal to logical 1 (active), and its Enable_slew signal to logical 1 (active). When Clear_SC_latcher is set to logical 1. (active), SC fault latcher 308 unlatches the PWM switches SW1A, SW2A, SW1B, SW2B, SW1C, and SW2C to the first position so that microcontroller 206 can exercise control of gate drive signals 202 using PWM techniques. When Clear_SC_timer is set to logical 1 (active) SC timer 310 (FIG. 3B) is cleared.

In step 412, microcontroller 206 sets the Enable_slew signal to logical 1 (active). Thereafter, in step 413 microcontroller 206 attempts to control a voltage reference signal V_ref to slew up with a predefined slew-up rate (e.g., a certain number of volts per millisecond); the voltage reference signal V_ref is used as voltage magnitude reference in a feedback control configuration to control output voltages in phases A, B, and C (see FIG. 5). The feedback of the output voltages in phases A, B, and C are obtained via the Vabc_digt signals from A/D converter 207.

Figure 5:
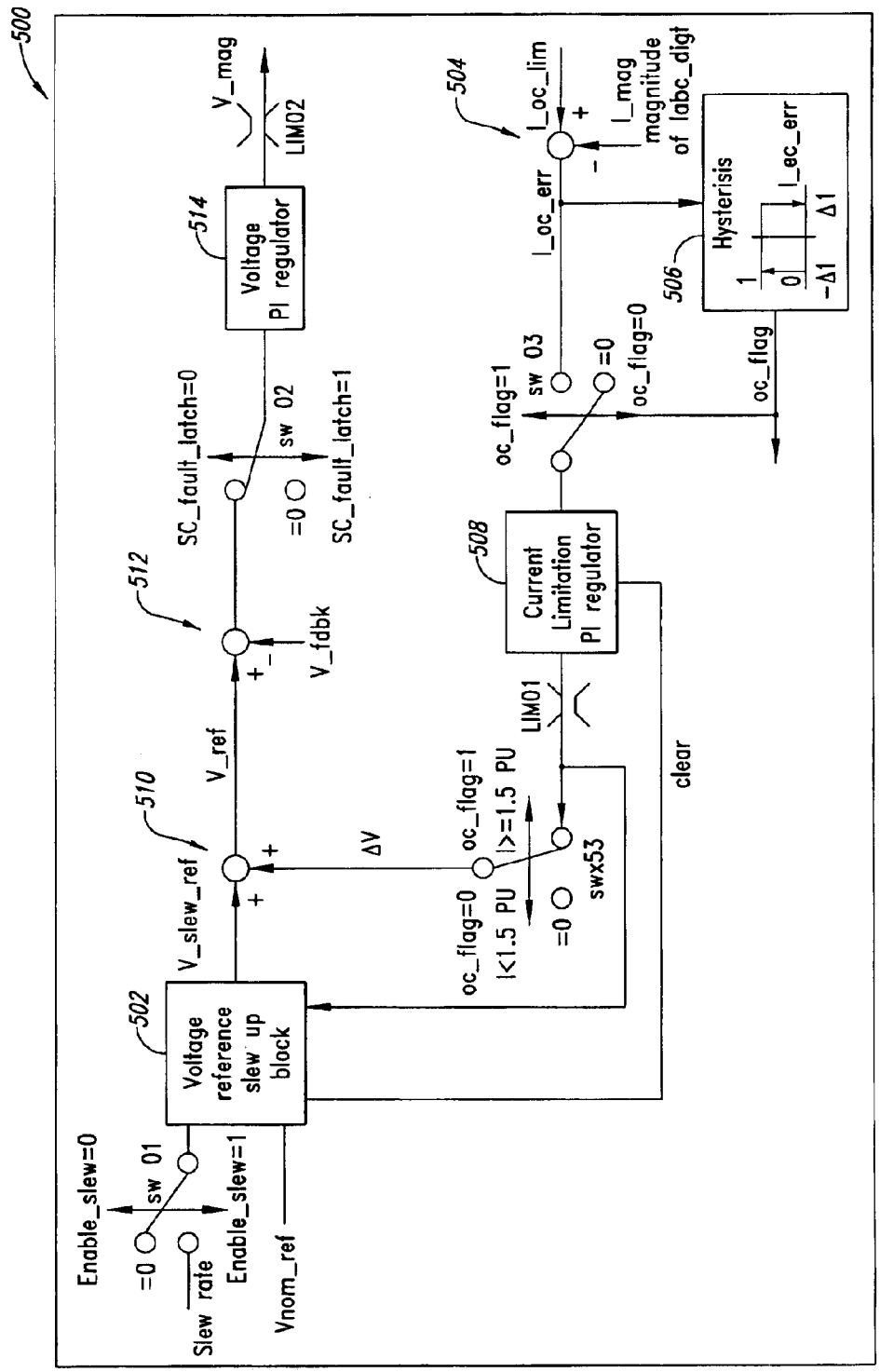
FIG. 5 is a partially schematic diagram of an implementation of current limiting logic, which can be implemented in software running on a microcontroller.

In step 414, microcontroller 206 ensures that, when the reference voltage for inverter 200 is being slewed up, inverter 200 is controlled in an effort to ensure that the magnitude of the current drawn from inverter 200 in any phase A, B, and C does not exceed a predefined overcurrent limit (e.g., 150% or 200% of nominal rated current). One implementation of logic for performing slew up of the voltage reference V_ref while limiting current is shown in FIG. 5.

In step 416, microcontroller 206 determines whether the magnitude of current drawn from inverter 200 in any phase A, B, C is greater than or equal to the predefined overcurrent limit (e.g., 150%–200% of the nominal rated current). In the current limiting logic 500 of FIG. 5, an overcurrent condition will result in an oc_flag being set to logical 1 (active). If the output current of any phase A, B, or C has magnitude greater than or equal to the predefined overcurrent limit, in step 418 microcontroller 206 increments a timer T_oc_sw used to count the time during which the magnitude of the output current of any phase is greater than or equal to the predefined overcurrent limit. In step 420, microcontroller 206 determines whether the count held in the timer T_oc_sw is larger than a predetermined upper limit T_oc_lim. If microcontroller 206 determines that the count held in the timer T_oc_sw is larger than a predetermined upper limit T_oc_lim, in step 422 microcontroller 206 shuts down operation of inverter 200. For example, in one implementation predetermined upper limit T_oc_lim is 10 seconds; if an overcurrent condition exists for longer than 10 seconds inverter 200 is shut down.

Returning to step 420, if microcontroller 206 determines that the count held in the timer T_oc_sw is NOT larger than the predetermined upper limit T_oc_lim, microcontroller 206 engages in step 414 as previously described.

Returning to step 416, if the output current of any phase is NOT greater than or equal to the predefined overcurrent limit (e.g., if fuses blow out or circuit breakers trip off in the short circuit path during the processes described in relation to FIGS. 2A–2B and 3A–3B, the voltage will come back to normal level without overcurrent occurring), then in step 424 microcontroller 206 determines if the voltage reference signal V_ref is within a defined tolerance of a nominal rated voltage value Vnom_ref. If the voltage reference signal V_ref is NOT within a defined tolerance of the nominal rated voltage (Vnom_ref), microcontroller 206 returns to step 413 and continues trying to slew up the voltage reference signal, V_ref.

Returning to step 424, if the voltage reference signal, V_ref, is within a defined tolerance of the nominal rated voltage Vnom_ref, in step 426 microcontroller 206 sets the SC_sw_flag to be logical 0 (inactive), the T_sc_sw timer to have value 0, the T_oc_sw timer to have value 0, and the Enable_slew signal to be logical 0 (inactive). That is, if the process of FIGS. 4A–4B arrives at step 426, it appears to the microcontroller 206 that the inverter 200 is operating within nominal parameters, and thus the short circuit variables can be zeroed and the slew-up logic can be deactivated. Thereafter, microcontroller 206 loops through step 400.

As noted above, by allowing current to decay to the load during the hardware detected short circuit, it is hoped that a fuse will be blown or a breaker will be tripped, thereby isolating any detected short circuit. This approach advantageously eliminates the need to produce or supply any additional current from the power source 100 beyond What has already been supplied to the inverter 200. It is possible, however, that not enough energy was delivered to blow the fuse or trip the circuit breaker. Accordingly, during the recovery process of steps 412–424, time is allowed during which current can flow at up to some predefined limit (e.g., 150% to 200% of nominal rated current) in an attempt to provide higher energy from inverter 200 to blow fuses or trip circuit breakers. However, if the current stays at or above the limit of nominal rated current for a long period of time (e.g., 10 seconds) it is assumed that the short circuit cannot be cleared and hence the process shuts down inverter 200, protecting the inverter 200 within the overload capacity.

FIG. 5 is a partially schematic diagram of an implementation of current limiting logic 500, which can be implemented in software running on microcontroller 206. Voltage reference slew up block 502 receives as input Enable_slew signal and Vnom_ref signal. Voltage reference slew up block 502 has been set to slew up its output voltage value V_slew_ref at a certain predetermined rate of volts per millisecond.

As noted above in relation to step 414 of FIG. 4B, current limiting logic 500 limits the current to a predefined limit when microcontroller 206 is slewing up the voltage reference signal V_ref. Accordingly, FIG. 5 illustrates (in the lower right-hand corner of FIG. 5) that junction 504 receives overcurrent limit voltage I_oc_lim (typically between 150% and 200% of nominal rated current) and the magnitude of the currents in phases A, B, and C via the Iabc_digt signal of A/D converter 207. Junction 504 produces an error signal I_oc_err representative of an amount by which the magnitude of a current in phase A, B, or C is different from the upper limit magnitude I_oc_lim. The error signal I_oc_err feeds to switch sw03.

In order to accommodate some minor fluctuations around the overcurrent limit voltage, switch sw03 is controlled by hysteresis comparator logic 506. In hysteresis comparator logic 506, when I_oc_err exceeds a value of the hysteresis comparator logic 506 by a predetermined amount (i.e., a defined $\Delta|$), an overcurrent condition detected oc_flag is set and held to logical 1 (active). When I_oc_err falls below the threshold by a designated amount, the overcurrent condition detected oc_flag is set and held to logical 0 (inactive). When the overcurrent condition detected flag is set to logical 1, switch sw03 is closed.

When switch sw03 is closed, the error signal I_oc_err feeds to current limitation proportional-integral (PI) regulator 508. Since hysteresis comparator logic 506 employs hysteresis, once switch sw03 is closed I_oc_err can take on both plus and minus values, within the limits of the hysteresis loop of hysteresis comparator logic 506, and thus the integral over time of the proportionally-scaled error signal I_oc_err can be either positive or negative.

Current limitation PI regulator 508 feeds switch swx53. Switch swx53 is closes when the oc_flag is set to logical 1 (active).

When switch swx53 is closed, the output ΔV of current limitation PI regulator 508 feeds to summing junction 510. If, over the time of integration of current limitation PI regulator 508, the error signal I_oc_err has been more negative than positive, ΔV will be negative and thus V_ref emerging from summing junction 510 will be reduced. Conversely, if over the time of integration of current limitation PI regulator 508 the error signal I_oc_err has been more positive than negative, ΔV will be positive. However, the limit or LIM01 clamps the positive value of ΔV to be "0", thus V_ref emerging from summing junction 510 will not be affected by current limitation PI regulator 508. In addition, voltage reference slew up block 502 adjusts its output V_slew_ref in response to the ΔV output of current limitation PI regulator 508, slowing or reversing the direction of the slew up when ΔV is negative, and maintaining the slew up rate when ΔV is zero or positive.

Summing junction 510 feeds to junction 512. Junction 512 creates an error signal based upon a difference between the voltage reference level V_ref and a feedback voltage of the phases A, B, and C of the secondary windings of three-phase AC transformer 214. In one implementation, the current limiting logic 500 is implemented in microcontroller 206, and thus the feedback voltage is supplied to microcontroller 206 via A/D converter 207, which receives the voltage from voltage sensor 212. The error signal of junction 512 feeds to switch sw02, which is closed if the SC_fault_latch signal is set to logical 0 (inactive), and which is open if the SC_fault_latch signal is set to logical 1 (active). When switch sw02 is closed, the error signal of junction 512 feeds to output voltage PI regulator 514. Microcontroller 206 uses this error signal to control inverter 200 to raise the output voltages in phases A, B, and C to the voltage reference level, V_ref. Hence, slewing up V_ref actually causes the output voltages in phases A, B, and C to slew up as junction 512 feeds to output voltage PI regulator 514, causing the output voltage to track the voltage reference level, V_ref, as V_ref slews up after fuse blows or breaker trips.

B. Alternate Devices and Processes

Figure 6:
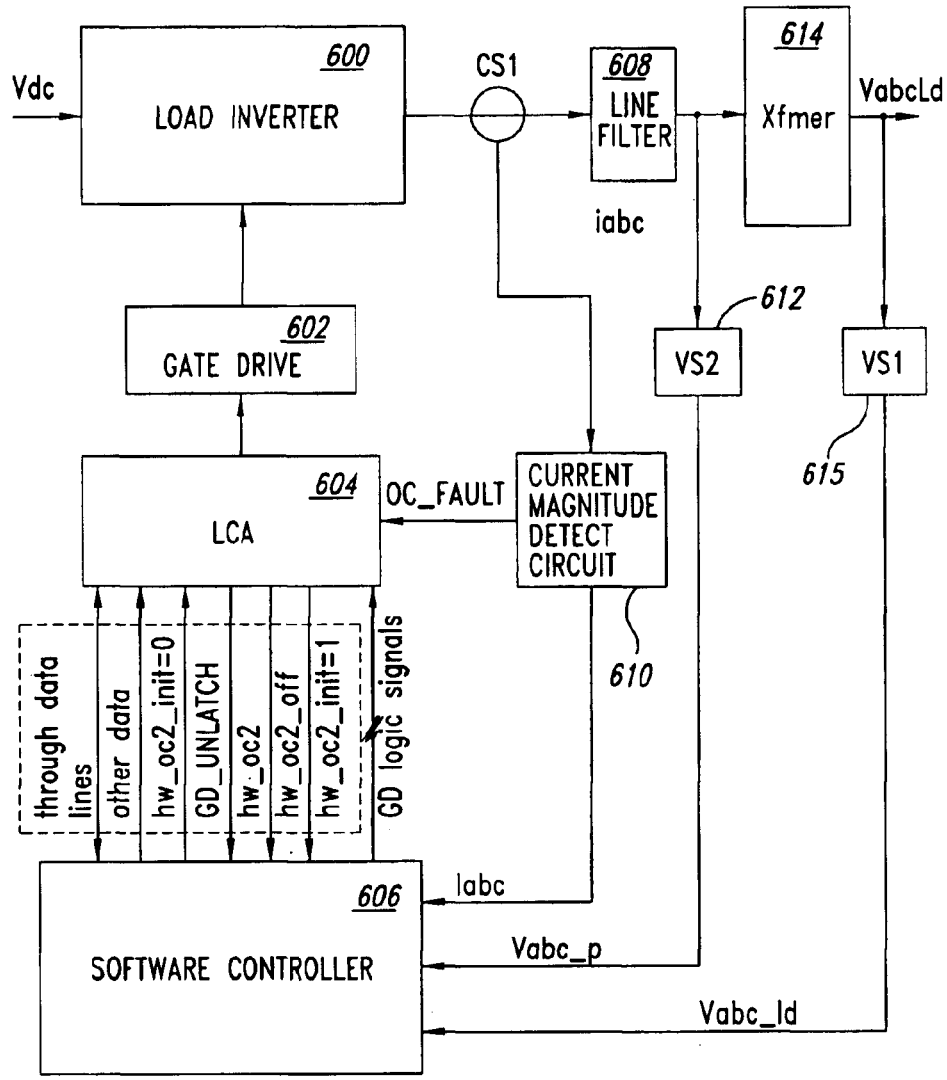
FIG. 6 is a high-level block diagram of a system that can be implemented in the context of UPS or other systems, and that can also be implemented as a stand alone system.

FIG. 6 is a high-level block diagram of a system that can be implemented in the context of Uninterruptible Power Supply (UPS) systems or other systems, and that can also be implemented as a stand alone system. Load inverter 600 receives input of Vdc. Load inverter 600 receives control information from inverter gate drive 602. Inverter gate drive 602 receives input from logic cell array (LCA) 604.

LCA 604 transmits and/or receives several signals between itself and software controller 606. As explained following, under certain conditions LCA 604 transmits to software controller 606 an initial hardware-detected overcurrent level 2 signal (hw_oc2_init=1); a hardware-detected overcurrent level 2 (hw_oc2) signal; and a hardware detected overcurrent level 2 fault signal (hw_oc2_off). As also explained following, under certain conditions software controller 606 transmits to LCA 604 a clear the initial hardware-detected overcurrent level 2 signal (hw_oc2_init=0); GD (inverter gate driver) unlatch signal; and GD logic signals. In addition, both LCA 604 and software controller 606 exchange through data and other signals.

Software controller 606 receives as input (a) the magnitude of the current in each of the three-phases of power transmitted between load inverter 600 and line filter 608, (b) the voltages on the three-phases transmitted between line filter 608 and the primary windings of three-phase transformer 614, and (c) the voltages transmitted on the three-phases of the output of the secondary windings of the transformer 614. The output of the secondary windings respectively feed the aggregate loads 102, 104, and 106 (FIG. 1).

Although only a single line is illustrated between load inverter 600 and line filter 608, and although only a single current sensor, CS1, is shown on that line, it is to be understood that in most embodiments load inverter 600 will be transmitting three-phase power to line filter 608, where each phase typically has its own current sensor. Although only a single line is illustrated between line filter 608 and three-phase AC transformer 614, it is to be understood that in most embodiments line filter 608 will be transmitting three-phase power to three-phase AC transformer 614. Although only a single line is illustrated exiting three-phase AC transformer 614, it is to be understood that in most embodiments three-phase AC transformer 614 will be respectively transmitting three-phase power over power lines, where each power line drives an aggregate load (e.g., loads 102, 104, and 106 of FIG. 1).

Software controller 606 receives a value indicative of the magnitude of the currents of the three-phase power transmitted between load inverter 600 and line filter 608 from current magnitude detect circuit 610. Current magnitude detect circuit 610 receives input from current sensors that sense the current of each of the three phases.(A, B, C). Current magnitude detect circuit 610 transmits an overcurrent fault signal (oc_fault) to LCA 604 when a fault, such as a short circuit, is detected on anyone or more of the three phases of electric power transmitted between load inverter 600 and line filter 608.

Software controller 606 receives the values of the voltages of each of the three-phases of power transmitted from line filter 608 to three-phase AC transformer 614 from voltage sensor circuitry 612. Voltage sensor circuitry 612 is coupled to sense the voltage on each of the three phases of electric power transmitted from line filter 608 to three-phase transformer 614.

Software controller 606 receives the values of the three-phases of the voltages on each of the three-phases of the output of three-phase AC transformer 614 from voltage sensor circuitry 615. Voltage sensor circuitry 615 is coupled to sense the voltage on each of the three phases of electric power which are supplied to aggregate loads (e.g., loads 102, 104, and 106 of FIG. 1).

The system of FIG. 6 can be used as a context for describing processes which provide for output heavy overload current (referred to herein as "overcurrent level 1") and/or short-circuit current (referred to herein as "overcurrent level 2") detection and protection. In one embodiment, when the sensed magnitude in at least one of the three phases of electric power exceeds 190 percent (190%)of the nominal rated current, a power converter continues to supply power for about five seconds—the concept being that such supply of power will blow any fuses and/or trip any circuit breakers that might be able to isolate a ground fault causing the short circuit condition. (As used herein, the nominal rated current refers to the near maximum current level of the normal operating range of a power source.) In one embodiment, it is preferable that the system detect that the sensed magnitude has exceeded 190 percent of the nominal rated current within sixty microseconds (60 μsec). Simultaneous with the power converter continuing to supply power for about five seconds, hardware, software, and or firmware of the system engage in various processes. Various embodiments of the various processes are illustrated following.

FIGS. 7A–7C show a high-level logic flowchart of a process. In one embodiment, the process is executed in primarily hardware logic (e.g., in one or more Application Specific Integrated Circuits).

The process starts at step 700. In step 702, current magnitude detect circuit 610 determines whether an output current (instantaneous) of inverter 600 is in an "overcurrent level 2 (or short circuit)" condition (e.g., greater than 190 percent of the nominal rated current). If the output current in one of the monitored phases IS in overcurrent level 2 (e.g., indicates a short circuit in a load), in method step 704 current magnitude detect circuit 610 sends an overcurrent level 2 fault (oc_fault) signal to LCA 604. In response to the overcurrent fault signal from current magnitude detect circuit 610, in step 706 LCA 604 causes an "initial hardware-detected overcurrent level 2 (hw_oc2_init)" line to have a value of logical 1 (active), and latches the line to the logical 1 status. Thereafter, in step 708 LCA 604 starts a hardware-resident "elapsed time since overcurrent level 2 initially detected" timer (t_oc2_lca). For example, in one embodiment time is counted from 0–20 seconds with a resolution of 0.08 seconds.

In step 710, LCA 604 sets the logic level of another line, the "hardware-detected overcurrent level 2" (hw_oc2) line to have value of logical 1 (active). In step 712, LCA 604 removes the inverter gate drive 602 control from software controller 606 (i.e., LCA 604 isolates the gate drive inputs from software controller 606), and sets phase A, B, C gate drive 602 logic in LCA 604 to have logical. "0, 0, 0" status. This logical "0, 0, 0" status is to make the load inverter 600 output voltage (60 hertz average voltage) 0 but not to disable the inverter 600. For example, in one embodiment the inverter is controlled such that at least one transformer terminal of AC three-phase transformer 614 is left connected to a ground terminal of a DC power bus, while other terminals are disconnected from the bus so that current can continue to flow to the aggregate loads.

In one implementation, steps 700–712 may be executed via a hardware implementation in less than five microseconds subsequent to detection of the instantaneous current in one of the phases being greater than 190 percent of the nominal rated current.

In step 714, LCA 604 checks the overcurrent level 2 fault signal from the current magnitude detect circuit 610. An overcurrent level 2 fault signal equal to an active value (logical 1), indicates that an instantaneous phase current magnitude is in overcurrent level 2 (e.g., is short circuited, which in one embodiment is when the current is greater than 190 percent of the nominal rated current), and thus LCA 604 proceeds to step 730.

An overcurrent level 2 fault signal equal to an inactive value (logical 0) indicates that the instantaneous phase current magnitude is NOT greater than 190 percent of the nominal rated current value. Consequently, in step 716 LCA 604 starts the hardware resident "elapsed time since current dropped below overcurrent level 2" timer (t_oc2_drop) in LCA 604 to count time. (The term "hardware resident" is used to highlight the fact that, in one implementation, a similarly named module exists in the software controller.)

In step 718, LCA 604 determines whether the value of the hardware-resident "elapsed time since current dropped below overcurrent level 2" (t_oc2_drop) timer is greater than 1.0 millisecond. If the elapsed time during which the current has been below 190 percent of the nominal rated current is greater than one millisecond (timer t_oc2_drop greater than one millisecond), in step 720 the LCA 604 causes the "hardware-detected overcurrent level 2" (hw_oc2) flag to have a value of logical "0" (inactive). The LCA 604 also subsequently clears the hardware-resident "elapsed time since current dropped below overcurrent level 2" (t_oc2_drop) timer. Thereafter, step 723 shows that the LCA 604 resumes monitoring for overcurrent level 2 (short circuit)by returning to step 700.

Returning now to step 718, if the elapsed time during which the current has been below 190 percent of the nominal rated current is NOT greater than one millisecond (timer t_oc2_drop NOT greater than one millisecond), in step 721 the LCA 604 determines whether the monitored current is still less than 190 percent of the nominal rated current. If the monitored current is still less than 190 percent of the nominal rated current, LCA 604 engages in step 718. If the monitored current exceeds 190 percent of the nominal rated current, in step 722 LCA 304 clears the hardware-resident "elapsed time since current dropped below overcurrent level 2" (t_oc2_drop) timer and resets the "hardware-detected overcurrent level 2" (hw_oc2) line to have value of logical 1 (active).

In step 724, LCA 304 determines whether an "unlatch" signal inverter gate driver 602 has been received from the software controller 606. If the unlatch signal has been received, in step 726 the LCA 604 releases the hardware latched 0,0,0 status of the gate drive 602. Accordingly, thereafter the phase A, B, C gate drive controls in LCA 604 will follow the logic level settings directed by software controller 606. In step 728, the timer t_oc2_lca is cleared. Thereafter, the LCA 604 resumes monitoring for overcurrent level 2 (short circuit) per step 731.

Returning now to step 724, if the unlatch signal has NOT been received, in step 730 LCA 604 checks the value of the hardware-resident "elapsed time since overcurrent level 2 initially detected" timer (t_oc2_lca). If the value of the hardware-resident "elapsed time since overcurrent level 2 initially detected"timer indicates that elapsed time is greater than one (1.0) second, in step 729 LCA 604 disables phase A, B, C gate drivers, opens the contactors between the three-phase transformer 614 and their respective loads, and latches the logic level of its hardware detected overcurrent level 2 fault line (hw_oc2_off) to have value of logical 1 (active). This means that an unclearable level 2 overcurrent fault has occurred.

The process of FIGS. 7A–7C terminates in step 732.

FIGS. 8A1–8A5 and 8B are a high-level logic flowchart depicting a process that interacts and occurs substantially simultaneously with the process described in relation to FIGS. 7A–7C. In one embodiment, the process of FIGS. 7A–7C is executing in hardware, while the process of FIGS. 8A1–8A5 and 8B is executing in software. The process of FIGS. 8A1–8A5 and 8B forms a continuous loop that starts at step 801.

Referring now to FIGS. 8A1–8A5, in step 801 software controller 606 determines whether the hardware detected overcurrent level 2 fault line (hw_oc2_off) of LCA 604 has been set to have a value of logical 1 (active). The hardware detected overcurrent level 2 fault line of LCA 604 being equal to an active value indicates that LCA 604 has shut down inverter 600 due to an unresolvable fault, and thus the process loops back to step 801. If the hardware detected over current level 2 fault line of LCA 604 is not active, software controller 606 continues onto method step 803.

In step 803, software controller 606 determines whether the path_flag variable has a value of logical one (active). If the path_flag variable does NOT have a value of logical one (active), in step 802 software controller 606 determines whether the "initial hardware-detected overcurrent level 2" (hw_oc2_init) line of LCA 604 has a value of logical one (active). If the initial hardware-detected overcurrent level 2

(hw_oc2_init) line of LCA 604 has been set to logical one (active), in step 806 software controller 606 sets the PWM pattern to be 0,0,0 for the IGBTs of the A, B, and C phase gate drivers (as discussed above). In step 806, software controller 606 also increments a software-resident "elapsed time-since the overcurrent level 2 initially detected timer" (t_oc2_init). In step 806, software controller 606 further increments a software-resident "aggregate total time that current magnitude exceeds 190 percent since initial hardware detected overcurrent level 2 line was detected to be active" (t_oc2) counter. The "elapsed time since the overcurrent level 2 initially detected" timer (t_oc2_init) counts the operation time since the hw_oc2_init line of LCA 604 was detected to be logical level 1 (active). Thus, the "elapsed time since the overcurrent level 2 initially detected" times (t_oc2_init) tracks the time during which the overcurrent condition exists, and as discussed below, is reset when the current falls below the overcurrent ratio (e.g., below 190 percent of the nominal rated current). The "aggregate total time that current magnitude exceeds 190 percent since initial hardware detected overcurrent level 2 line was detected to be active" (t_oc2) timer tracks the aggregate time during which inverter 600 is in short-circuit mode when inverter 600 has been subject to both short-circuit (i.e., overcurrent level 2) and heavy overload (i.e., overcurrent level 1, described below) in relatively quick succession.

In step 808, software controller 606 determines if the hardware-detected overcurrent level 2 (hw_oc2) line of LCA 604 has a value of logical zero (inactive). If software controller 606 finds that the hardware-detected overcurrent level 2 (hw_oc2) line of LCA 604 has a value of logical zero (inactive), in step 810 software controller 606 disables the hardware latches of the inverter gate drive 602, which were previously latched at status 0,0,0 by LCA 604. Further in step 810, software controller 606 assumes control of the gate drive controls of inverter gate drive 602 from LCA 604 hardware by enabling software gate drivers, and also sets the path_flag variable to have a value of logical 1 (active). Subsequent to taking control of inverter gate drive 602, software controller 606 initially keeps the PWM logic pattern at 0,0,0 for the A, B, C gate drivers.

In step 811 software controller 606 increments the software resident elapsed time since the overcurrent level 2 initially detected (T_oc2_init) timer.

In step 822, software controller 606 determines whether the software resident initially hardware-detected overcurrent level 2 (T_oc2_init) timer contains a value of greater than 5.0 seconds. If the software resident initially hardware-detected overcurrent level 2 (t_oc2_init) timer contains a value of greater than 5.0 seconds, the process proceeds to step 862, wherein software controller 606 disables load inverter's gate drive 602 for all three phases and opens the contactors between the power source (e.g., a UPS) and supplied aggregate loads (e.g., loads 102,104, and 106 of FIG. 1).

If the software resident initially hardware-detected overcurrent level 2 (t_oc2_init) timer is NOT greater than 5.0 seconds, in step 816, software controller 606 determines whether the sum of the elapsed time in either level 1 (heavy overload) or level 2 (short-circuit) overcurrent mode (e.g., t_oc 1+t_oc 2) is greater than 4.5 seconds. If software controller 606 determines that the sum of the elapsed time in either level 1 or level 2 overcurrent mode IS greater than 4.5 seconds, the process proceeds to step 862. In step 862, the software controller 606 disables load inverter's gate drive 602 for all three phases and opens the contactors between the power source (e.g., a UPS) and supplied aggregate loads (e.g., loads 102,104, and 106 of FIG. 1).

If software controller 606 determines that the sum of the elapsed time in either level 1 (heavy overload) or level 2 (short-circuit) overcurrent mode is NOT greater than 4.5 seconds, control passes to step 817. In step 817 the software controller 606 determines whether the "number of consecutive software program loops during which inverter 600 is in overcurrent level 2 (no_oc_2)" counter has a value equal to 3. As discussed below, in relation to steps 817 and 833, the process of FIGS. 8A1–8A5 and 8B keeps a count of the number of consecutive process loops of FIGS. 8A1–8A5 and 8B in which the hardware overcurrent level 2 line of LCA 604 has remained active.

If software controller 606 determines that the number of consecutive software program loops during which inverter 600 is in overcurrent level 2 (no_oc 2) counter has a value equal to 3, control passes to step 819. In step 819 the software controller 606 disables the load inverter's gate drive 602 for all three phases and opens the contactors between the power source and the supplied aggregate loads. The counter value equal to three is a design choice that the system designer has chosen to indicate that an unresolvable short-circuit in the load supplied by inverter 600 exists.

If software controller 606 determines that the number of consecutive software program loops during which inverter 600 is in overcurrent level 2 (no_oc2) counter does NOT have a value equal to three, in step 821 software controller 606 determines if the hardware-detected overcurrent level 2 (hw_oc2) line of LCA 604 has value of logical zero (inactive). If software controller 606 determines that the hardware-detected overcurrent level 2 (hw_oc2) line has a value of logical zero (inactive), in step 823 software controller 606 sets the variable oc2_state to have value of logical "0" (and active). The variable oc2_state is used by the process of FIGS. 8A1–8A5 and 8B as a method for indicating whether inverter 600 is in an overcurrent level 2 condition.

In step 850, software controller 606 determines if the if the variable over_oc_1 has been set to have logical value one (active). The variable over_oc_1 is set active when magnitude of a phase current (the current in one of the phases of transmitted power) from load inverter 600 to line filter exceeds a predefined overcurrent level 1 (heavy overload) threshold (e.g., 150% of the nominal rated current). If a magnitude of a monitored phase current is in overcurrent level 1 (e.g., exceeds 150% of nominal rated current), in step 853 software controller 606 increments the software-resident elapsed time during current level 1 (heavy overload) timer (T_oc1) and then loops back to step 801.

Returning to step 850, if software controller 606 determines that the magnitude of the monitored phase current does NOT exceed a predefined in overcurrent level 1 value (e.g., exceeds 150% of nominal rated current), in step 818 software controller 606 returns the system to stand alone voltage (SAV_Mode) control. In one embodiment this is performed by slewing up the output voltage magnitude reference with slew up rate of one (1) volt/millisecond and with current limitation at 150 percent nominal value.

In step 825, software controller 606 checks to see whether ud_ref is greater than or equal to Vm_nom. This is a test condition to indicate whether inverter 600 has entered its normal mode of operation by determining whether the slew-up reference voltage is within a tolerance relative to a nominal rated voltage at which inverter 600 is designed to operate. In the event that software controller 606 determines that inverter 600 has entered its normal mode of operation, control passes to step 827. In step 827, software controller 606 zeros out the path_flag variable. The software controller 606 also zeros out the software-resident elapsed time during overcurrent level 1 (heavy overload) timer (t_oc1) and the software-resident aggregate total time that current magnitude exceeds 190 percent since initial hardware detected overcurrent level 2 line was detected to be active (t_oc2) timer. In step 827, the software controller 606 further zeros out the software-resident initially hardware-detected overcurrent level 2 (t_oc2_init) timer and the software-resident no_oc 2 counter. Furthermore, software controller 606 sends a command to LCA 604 where the command instructs LCA 604 to clear LCA 604's initial hardware detected overcurrent level 2 line (e.g., hw_oc2_init=0). Thereafter, the software controller 606 loops back to step 801.

Returning to step 825, if software controller 606 determines the inverter 600 has not entered its normal mode of operation, the software controller 606 loops back to step 801.

Returning now to step 821, if software controller 606 determines that the hardware-detected overcurrent level 2 (hw_oc2) line of LCA 604 does NOT have a value of logical zero (inactive), control passes to step 829. In step 829, software controller 606 (a) sets the PWM (Pulse Width Modulated) pattern to be 0,0,0 for the IGBTs of the A, B, and C phase gate drivers, and (b) sets the reference voltage for the voltage control to Vm_ref=0. The PWM pattern is set to 0,0,0, and the reference voltage for the voltage control is set to Vm_ref=0 so that energy can be supplied to the short circuit by the transformer windings all the way down to 0 volts output. The settings are intended to allow the average output voltage to go to zero, but without completely disabling inverter 600. One skilled in the art will recognize other approaches to achieve the determined effect.

As can be seen from the logic of the process of FIGS. 8A1–8A5 and 8B, if software controller arrives at step 831, inverter 600 is in a hardware detected overcurrent level 2 state. Consequently, the overcurrent level 2 flag should be set to be active. To ensure that this is true, in step 831 software controller 606 determines whether the "overcurrent level 2 state (oc2_state)" flag has a value of logical one (active). If in step 831, software controller 606 determines that the variable overcurrent level 2 state (oc2_state) does has NOT have a value of logical one (active), in step 833, software controller 606 sets the overcurrent level (oc2_state) 2 flag to have value of logical 1 (active) and software controller 606 also increments number of consecutive software program loops during which inverter 600 is in overcurrent level 2 (no_oc2) counter. In step 835, software controller 606 increments the software-resident aggregate total time that current magnitude exceeds 190 percent since initial hardware detected overcurrent level 2 line was detected to be active (T_oc2) timer. Thereafter, the process loops back to step 801.

Returning now to step 816, in the event that software controller 606 determines that the aggregate time in overcurrent mode is greater than 4.5 seconds, in step 862 software controller 606 disables the load inverter's gate drive 602 for all three phases and opens the contactors between a UPS and the supplied aggregate loads 102,104, and 106.

Returning now to step 808, if software controller 606 determines that the hardware-detected overcurrent level 2 (hw_oc2) line of LCA 604 does NOT have a value of logical zero (inactive), the software controller proceeds to loop back to step 801.

Returning to step 802, if software controller 606 determines that the initial hardware-detected overcurrent level 2 (hw_oc2_init) line of LCA 604 does NOT have a value of logical one (active), in step 852 software controller 606 determines if the overcurrent level 1 flag (Flg_oc) has a value of logical one (active). In one embodiment, the software controller 606 sets the overcurrent level 1 flag to logical one (active) when the magnitude of a phase current (in the current in one of the phases of transmitted) from the load inverter 600 to the line filter exceeds a predefined overcurrent level one threshold (e.g., 150% of the nominal rated current). If the overcurrent level 1 flag is not set active (e.g., no monitored phase current is in heavy overload), software controller 606 loops back to step 801 as shown.

Figure 8B:
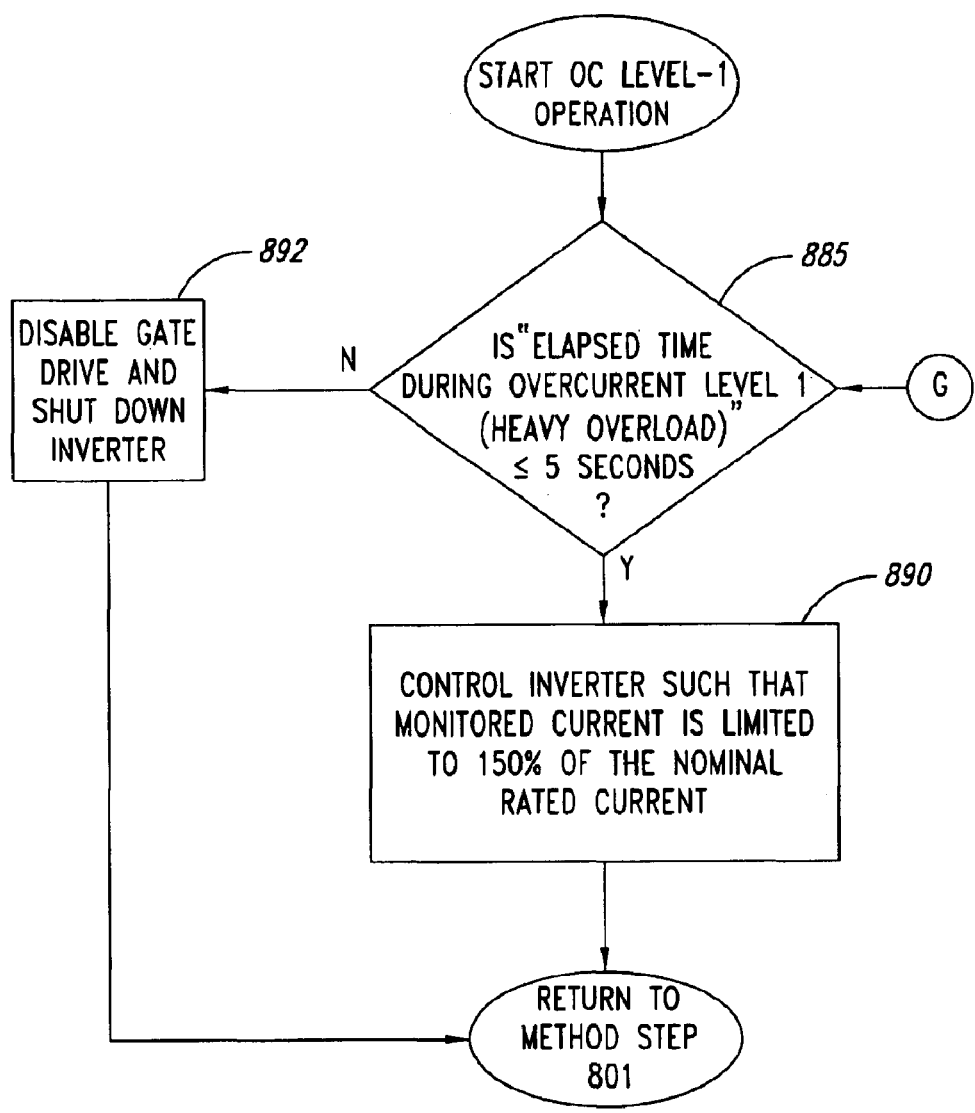

Returning now to step 852, if software controller 606 determines that the overcurrent level 1 flag (Flg_oc) has a value of logical one (active), in step 882 software controller 606 switches the system of FIG. 6 from a stand alone voltage mode (SAV_Mode) to a stand alone current control mode (SA I_lim_Mode) and also causes the software-resident "elapsed time during overcurrent level 1 (heavy overload)" timer (T_oc1_clr) to be started. Thereafter, software controller 606 engages in overcurrent level 1 operations, one embodiment of which is shown in FIG. 8B. In one embodiment, the detections of steps 852 and 882 are achieved in a software implementation and occur in less than 1 ms after the overcurrent condition is detected by the software controller 606. Subsequent to engaging in the steps of FIG. 8B, software controller 606 loops back to step 801 as shown.

Referring now to FIG. 8B, in step 885 the software controller checks the software-resident "elapsed time during overcurrent level 1 (heavy overload)" timer (T_oc1_clr) to determine if the duration of the heavy overload condition is less than or equal to 6 seconds. In an alternate implementation, this time is 10 seconds. If the value of the software-resident "elapsed time during overcurrent level 1 (heavy overload)" timer (T_oc1_clr) is less than or equal to 5 seconds, in step 890 software controller 606 controls the inverter 600 such that the monitored current is limited to a certain preset upper limit (e.g., 150% of the nominal rated current). In one embodiment, the power converter's output voltage will drop as low as is needed to control the phase current below the preset limit. Thereafter software controller 606 loops back to step 801.

Returning now to step 885, if software controller 606 determines that the software-resident "elapsed time during overcurrent level 1 (heavy overload)" timer (T_oc1_clr) has a value greater than 6 seconds, in method step 892 the software controller 606 disables the inverter gate drive 602 and shuts down the inverter 600. Thereafter, software controller 606 loops back to step 801.

As described in relation to the process of FIGS. 8A1–8A5 and 8B, in one embodiment the software controller 606 scans the status of the initial hardware-detected overcurrent level 2 (hw_oc2_init) line of LCA 604, the hardware-detected overcurrent level 2 (hw_oc2) line of LCA 604, and the hardware detected overcurrent level 2 fault (hw_oc2_off) line of LCA 604. In one embodiment, these lines of LCA 604 are scanned at least once every one millisecond.

As noted above, when inverter 600 is operating in neither overcurrent level 1 nor overcurrent level 2, software controller 606 returns the system to stand alone voltage mode (SAV_Mode) control by slewing up the reference voltage used by a voltage mode controller.

In one embodiment, when neither an overcurrent level 1 nor an overcurrent level 2 condition has been detected, as noted above, the system operates in stand alone voltage mode. That is, software controller 606 controls the system such that the voltages delivered to the loads are within defined tolerances of nominal voltage values.

In one implementation, software controller 606 effects control of each phase A, B, and C output voltage by use of PI regulator methodology that monitors an output voltage of each particular phase, and effects control such that the output voltage is within a defined tolerance of a defined reference voltage V_ref.

As is apparent above, when an overcurrent level 2 condition (short circuit) is detected, in some implementations hardware aspects of the system assume control and set inverter 600 such that current can still flow out to one or more aggregate loads while the inverter is at 0 volts. As also discussed above, after the current drops below the overcurrent level 2 conditions (short circuit), software controller 606 attempts to return to stand alone voltage mode control by slewing up the reference voltage, V_ref, used by the PI controller at a controlled rate (e.g., 1 volt/millisecond) and with an ultimate current limitation (e.g., current limited to 150 percent of a nominal value). In one implementation, this is achieved by software controller 606 slowing and/or reversing the slew up of the reference voltage V_ref when the monitored current exceeds the ultimate current limitation. In another implementation, in addition the value of the reference voltage V_ref is actually decreased in near-real time responsive to the monitored current exceeding the ultimate current limitation. In yet another embodiment, the foregoing referenced embodiments are analogous to the system shown and described in relation to FIG. 5, above.

Those having ordinary skill in the art will recognize that the state of the art has progressed to the point where there is little distinction left between hardware and software implementations of aspects of systems; the use of hardware or software is generally a design choice representing cost vs. efficiency tradeoffs (but not always, in that in certain contexts the choice between hardware and software can become significant—for instance, such as was shown and described above, detection and ride through related to short circuit overcurrent is currently implemented in hardware/firmware, in that current processors may not fast enough to provide such monitoring under software control without damaging an electronic power converter, although it is possible that sometime in the future processors may become fast enough to provide what can now only be provided in hardware, at present such software control is not practicable).

The foregoing detailed description has set forth various embodiments of the devices and/or processes via the use of block diagrams, flowcharts, and examples. In one embodiment, the hardware specific aspects of the present invention may be implemented via Application Specific Integrated Circuits (ASICs). However, those skilled in the art will recognize that the hardware specific embodiments disclosed herein, in whole or in part, can be equivalently implemented in standard Integrated Circuits, or other types of electrical circuits. In addition, those skilled in the art will appreciate that the software specific mechanisms of the present invention are capable of being distributed as a program product in a variety of forms, and that an illustrative embodiment of the present invention applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analogue communication links, using TDM or IP based communication links (e.g., packet links).

The foregoing described embodiments depict different components contained within, or connected with, different other components. It is to be understood that such depicted architectures are merely exemplary, and that in fact many other architectures can be implemented which achieve the same functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method of operating an electronic power converter that supplies electrical power to at least one load, the method comprising:
monitoring at least one characteristic of the electrical power supplied by the electronic power converter;
determining from the at least one monitored characteristic that a short circuit condition of a current provided by the electronic power converter to the load exists; and
maintaining the current provided by the electronic power converter to the load in response to the determination that the short circuit condition of the current exists.

2. The method of claim 1 wherein determining from the at least one monitored characteristic that a short circuit condition of a current provided by the electronic power converter to the load exists, comprises:
determining that the current provided by the electronic power converter is greater than a multiple of a nominal rated current.

3. The method of claim 1 wherein determining from the at least one monitored characteristic that a short circuit condition of a current provided by the electronic power converter to the load exists, comprises:
determining that the current provided by the electronic power converter is greater than 250% of a nominal rated current.

4. The method of claim 1 wherein maintaining the current provided by the electronic power converter to the load in response to the determination that the short circuit condition of the current exists, comprises:
coupling at least one terminal of a DC bus to at least one terminal of an AC transformer.

5. The method of claim 1 wherein maintaining the current provided by the electronic power converter to the load in response to the determination that the short circuit condition of the current exists, comprises:
coupling a negative terminal of a DC bus to a first terminal of an AC transformer and decoupling a positive terminal of the DC bus from a second terminal of the AC transformer.

6. The method of claim 1, further comprising:
decoupling the electronic power converter from a DC bus when a duration of the determined short circuit condition exceeds a predetermined short circuit current time limit.

7. The method of claim 1 wherein maintaining the current provided by the electronic power converter to the load in response to the determination that the short circuit condition of the current exists, comprises:
determining that a magnitude of the current provided by the electronic power converter is below a short circuit current magnitude; and driving the current at a magnitude below the short circuit current magnitude.

8. The method of claim 1 wherein maintaining the current provided by the electronic power converter to the load in response to the determination that the short circuit condition of the current exists, comprises:

determining that a magnitude of the current provided by the electronic power converter is below a short circuit current magnitude; and slewing up a reference voltage such that the current provided by the electronic power converter has a magnitude below the short circuit current magnitude.

9. The method of claim 1 wherein maintaining the current provided by the electronic power converter to the load in response to the determination that the short circuit condition of the current exists, comprises:

determining that a magnitude of the current provided by the electronic power converter is below a short circuit current magnitude; and controlling a slew up rate of a reference voltage such that the current provided by the electronic power converter has a magnitude below the short circuit current magnitude and higher than a rated current magnitude.

10. The method of claim 1, further comprising:

decoupling the electronic power converter from a DC bus when a time during which the current provided by the electronic power converter is above a nominal current magnitude exceeds a predetermined heavy overload current time limit.

11. A system comprising:

an electronic power converter that supplies electrical power to at least one load;

means for monitoring at least one characteristic of the electrical power supplied by the electronic power converter;

means for determining from the at least one monitored characteristic that a short circuit condition of a current provided by the electronic power converter to the load exists; and means for maintaining the current provided by the electronic power converter to the load in response to the determination that the short circuit condition of the current exists.

12. A system comprising:

an electronic power converter that supplies electrical power to at least one load;

electrical circuitry for monitoring at least one characteristic of the electrical power supplied by the electronic power converter;

electrical circuitry for determining from the at least one monitored characteristic that a short circuit condition of a current provided by the electronic power converter to the load exists; and electrical circuitry for maintaining the current provided by the electronic power converter to the load in response to the determination that the short circuit condition of the current exists.

13. The system of claim 12 wherein the electrical circuitry for determining from the at least one monitored characteristic that a short circuit condition of a current provided by the electronic power converter to the load exists, comprises:

electrical circuitry for determining the current provided by the electronic power converter to be greater than a multiple of a nominal rated current.

14. The system of claim 12 wherein the electrical circuitry for determining from the at least one monitored characteristic that a short circuit condition of a current provided by the electronic power converter to the load exists, comprises:

electrical circuitry for determining the current provided by the electronic power converter to be greater than 250% of a nominal rated current.

15. The system of claim 12 wherein the electrical circuitry for maintaining the current provided by the electronic power converter to the load in response to the determination that the short circuit condition of the current exists, comprises:

electrical circuitry for coupling at least one terminal of a DC bus to at least one terminal of an AC transformer.

16. The system of claim 12 wherein the electrical circuitry for maintaining the current provided by the electronic power converter to the load in response to the determination that the short circuit condition of the current exists, comprises:

electrical circuitry for coupling a negative terminal of a DC bus to a first terminal of an AC transformer and decoupling a positive terminal of the DC bus from a second terminal of the AC transformer.

17. The system of claim 12, further comprising:

electrical circuitry for decoupling the electronic power converter from a DC bus when a duration of the determined short circuit condition exceeds a predetermined short circuit current time limit.

18. The system of claim 12 wherein the electrical circuitry for maintaining the current provided by the electronic power converter to the load in response to the determination that the short circuit condition of the current exists, comprises:

electrical circuitry for determining that a magnitude of the current provided by the electronic power converter is below a short circuit current magnitude; and electrical circuitry for driving the current at a magnitude below the short circuit current magnitude.

19. The system of claim 12 wherein the electrical circuitry for maintaining the current provided by the electronic power converter to the load in response to the determination that the short circuit condition of the current exists, comprises:

electrical circuitry for determining that a magnitude of the current provided by the electronic power converter is below a short circuit current magnitude; and electrical circuitry for slewing up a reference voltage such that the current provided by the electronic power converter has a magnitude below the short circuit current magnitude.

20. The system of claim 12 wherein the electrical circuitry for maintaining the current provided by the electronic power converter to the load in response to the determination that the short circuit condition of the current exists, comprises:

electrical circuitry for determining that a magnitude of the current provided by the electronic power converter is below a short circuit current magnitude; and electrical circuitry for controlling a slew up rate of a reference voltage such that the current provided by the electronic power converter has a magnitude below the short circuit current magnitude and above a rated current magnitude.

21. The system of claim 12, further comprising:

electrical circuitry for decoupling the electronic power converter from a DC bus when a time during which the current provided by the electronic power converter is above a nominal current magnitude exceeds a predetermined heavy overload current time limit.

22. A system, comprising:

a current sensor to sense a current provided by an electronic power converter, the electronic power converter supplying electrical power to at least one load, the current sensor comprising an output;

an overcurrent detection circuit comprising an input coupled to an output of the current sensor, the overcurrent detection circuit configured to determine whether an overcurrent condition exists based on information from the output of the current sensor; and a logic control circuit configurable to maintain the current provided by the electronic power converter in response to the sensed current having a magnitude approximately equal to a short circuit magnitude, the logic control circuit comprising an input coupled to an output of the overcurrent detection circuit and at least one output coupled to at least one switch of the electronic power converter.

23. The system of claim 22 wherein the current sensor is coupled to sense at least one phase of a multi-phase current provided by the electronic power converter.

24. The system of claim 22 wherein the overcurrent detection circuit is coupled to at least one phase of a multi-phase output of the current sensor.

25. The system of claim 22 wherein the logic control circuit is configurable to couple at least one switch to at least one terminal of a DC bus with at least one terminal of an AC transformer in response to the magnitude of the sensed current being approximately equal to the short circuit magnitude.

26. The system of claim 22, further comprising a microcontroller configured to maintain the current provided by the electronic power converter at a magnitude above a nominal rated current in response to the magnitude of the sensed current falling below the short circuit magnitude.

27. The system of claim 22, further comprising logic configured to slew up a reference voltage such that the magnitude of the sensed current is limited by an upper threshold magnitude.

* * * * *

UNITED STATES PATENT AND TRADEMARK OFFICE
CERTIFICATE OF CORRECTION

PATENT NO. : 6,900,643 B2  Page 1 of 1
DATED : May 31, 2005
INVENTOR(S) : Duo Deng et al.

It is certified that error appears in the above-identified patent and that said Letters Patent is hereby corrected as shown below:

Column 18,
Lines 28, 34, 42, 48 and 61, "claim 1 wherein" should read as -- claim 1, wherein --.

Column 19,
Lines 3 and 13, "claim 1 wherein" should read as -- claim 1, wherein --.
Lines 59 and 66, "claim 12 wherein" should read as -- claim 12, wherein --.

Column 20,
Lines 6, 12, 26, 35 and 47, "claim 12 wherein" should read -- claim 12, wherein --.

Signed and Sealed this

Fourth Day of October, 2005

JON W. DUDAS
*Director of the United States Patent and Trademark Office*